(12) United States Patent
Shirasaka et al.

(10) Patent No.: US 7,554,182 B2
(45) Date of Patent: Jun. 30, 2009

(54) SEMICONDUCTOR DEVICE AND PACKAGE, AND METHOD OF MANUFACTURER THEREFOR

(75) Inventors: Kenichi Shirasaka, Hamamatsu (JP); Hiroshi Saitoh, Iwata-gun (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/516,705

(22) Filed: Sep. 7, 2006

(65) Prior Publication Data

US 2007/0001275 A1    Jan. 4, 2007

Related U.S. Application Data

(63) Continuation of application No. 10/120,391, filed on Apr. 12, 2002, now Pat. No. 7,170,149.

(30) Foreign Application Priority Data

Apr. 13, 2001  (JP) ............................ 2001-115381
Jan. 22, 2002  (JP) ............................ 2002-013159

(51) Int. Cl.
*H01L 23/495* (2006.01)

(52) U.S. Cl. ..................... 257/676; 257/787; 257/666; 257/692; 438/126; 438/127

(58) Field of Classification Search ................. 257/692, 257/676, 666, 784, 787; 438/111, 112, 123, 438/124, 126, 127
See application file for complete search history.

(56) References Cited

U.S. PATENT DOCUMENTS 5,869,887 A     2/1999  Urushima
6,166,430 A *  12/2000  Yamaguchi
6,291,274 B1 * 9/2001  Oida et al.

6,338,984 B2 *  1/2002  Minamio et al.

(Continued)

FOREIGN PATENT DOCUMENTS

JP          6-242342          9/1994

(Continued)

OTHER PUBLICATIONS

Japanese Office Action dated May 24, 2005 (and English translation of same).

(Continued)

*Primary Examiner*—S. V Clark
(74) *Attorney, Agent, or Firm*—Dickstein Shapiro LLP

(57) ABSTRACT

A semiconductor package encapsulating a semiconductor chip provides inner leads and outer leads for establishing electrical connections with the substrate. Herein, a lead frame is set into the metal mold, into which a resin is injected and which is clamped in proximity to the outer leads. Thus, the semiconductor package is sealed so as to avoid unwanted formation of resin burrs around lower surfaces of the inner leads. In addition, a semiconductor device is produced using a package in which a semiconductor chip mounted on a stage and terminals are embedded within a resin. Each terminal provides an electrode surface, an interconnecting portion, and an exposed terminal surface. Herein, an isolation portion is formed as an integral part of the package made by the resin and is arranged in the prescribed area between the electrode surface and the exposed terminal surface.

9 Claims, 20 Drawing Sheets

U.S. PATENT DOCUMENTS

| | | |
|---|---|---|
| 6,455,348 B1 * | 9/2002 | Yamaguchi |
| 6,501,161 B1 * | 12/2002 | Lee |
| 6,537,858 B1 * | 3/2003 | Shibata ................ 438/124 |
| 6,545,332 B2 * | 4/2003 | Huang |
| 6,580,161 B2 * | 6/2003 | Kobayakawa |
| 6,855,577 B2 * | 2/2005 | Azuma ................ 438/118 |

FOREIGN PATENT DOCUMENTS

| | | |
|---|---|---|
| JP | 8-250641 | 9/1996 |
| JP | 09-270487 | 10/1997 |
| JP | 08-241592 | 9/1998 |
| JP | 19-275887 | 10/1998 |
| JP | 11-074404 | 3/1999 |
| JP | 11-195733 | 7/1999 |
| JP | 11-233683 | 8/1999 |
| JP | 11-287925 | 10/1999 |
| JP | 3012816 | 12/1999 |
| JP | 2000-12758 | 1/2000 |
| JP | 2000-49196 | 2/2000 |
| JP | 2000-91488 | 3/2000 |
| JP | 2000-223611 | 8/2000 |
| JP | 2000-243891 | 9/2000 |
| JP | 2000-286375 | 10/2000 |
| JP | 2001-24135 | 1/2001 |
| JP | 2001-313363 | 11/2001 |
| JP | 2001-326295 | 11/2001 |
| JP | 2002-261226 | 9/2002 |
| TW | 90103772 A | 2/2001 |

OTHER PUBLICATIONS

Japanese Office Action dated Mar. 7, 2008 (and English translation of relevant portions).

Taiwanese Office Action dated Feb. 18, 2003 (and English translation of relevant portion).

Korean Office Action dated Nov. 30, 2004 (and English translation of same).

The People's Republic of China Office Action dated Jul. 22, 2005 (and English translation of same).

Abstracts (2) of Taiwanese Patent TW 472375 (priority application TW 90103772 A).

* cited by examiner

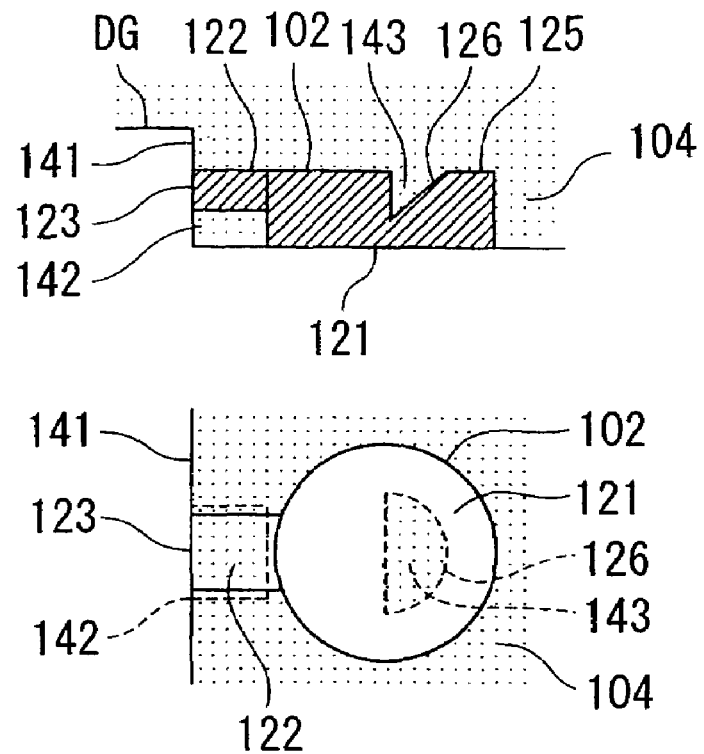
FIG. 13A
FIG. 13B
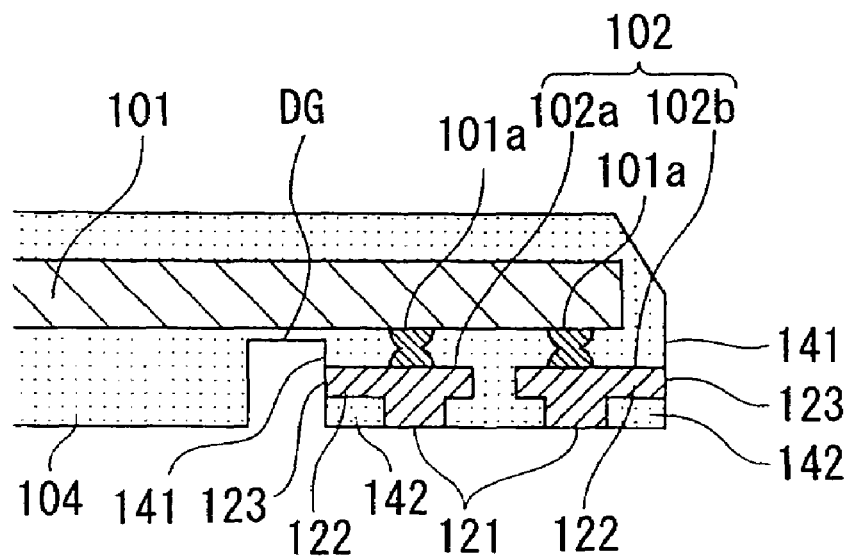
FIG. 14

SEMICONDUCTOR DEVICE AND PACKAGE, AND METHOD OF MANUFACTURER THEREFOR

CROSS-REFERENCE TO RELATED APPLICATION

This application is a continuation under 35 U.S.C. § 120 of U.S. application Ser. No. 10/120,391, filed Apr. 12, 2002, the entirety of which is incorporated by reference herein.

BACKGROUND OF THE INVENTION

1. Field of the Invention

This invention relates to semiconductor devices that provide semiconductor chips and components encapsulated in packages by resins. This invention also relates to methods of manufacturing semiconductor devices and packages.

2. Description of the Related Art

Recent progresses of electronic and information technologies provide a variety of electronic devices that use considerable numbers of semiconductor components installed therein in a highly concentrated manner. This brings a strong demand to downsize packages for encapsulating semiconductor components and chips in resins. Conventionally, so-called QFN packages (namely, quad flatpack non-leaded packages) are used to realize the downsizing of the packages. The QFN package eliminates outer leads, which were conventionally projected from side portions of the package, while providing external electrodes allowing electrical connections with the substrate on the lower surface thereof.

In order to ensure the airtightness, the packages are normally constituted of lead frames enclosed or sealed within resins. Japanese Patent No. 3012816 teaches a typical example of the QFN package in which both the upper and lower surfaces of the lead frame are sealed with a resin to increase the airtightness. Japanese Unexamined Patent Publication No. 2000-243891 teaches another example of the QFN package in which in order to improve the heat radiation or dissipation, the lower surface of the stage for supporting a semiconductor chip is exposed while the lead frame is enclosed or sealed within the resin.

As described above, the conventional packages are designed to enclose or seal semiconductor chips and lead frames within resins in various manners. However, the number of leads that can be provided for the package must be limited by the resin sealed area representing the prescribed portion of the package sealed within the resin. In order to secure the necessary number of leads, it is necessary to enlarge the resin sealed area, which may create difficulty in downsizing of the package.

In the general configuration of a semiconductor device that is sealed in a resin package, a semiconductor chip is electrically connected with terminals, which are partially exposed as electrodes. In this manner, the semiconductor chip and terminals are integrally assembled together in the resin package having 'exposed' electrodes. Conventionally, the terminals project from the side surfaces of the package of the semiconductor device. In response to the demand for increasing the number of terminals drawn out from the package and the demand for downsizing the package, recent semiconductor technology provides the so-called LGA type (wherein 'LGA' is an abbreviation for 'Land Grid Array'), in which numerous terminals are aligned on the backside of the package, which is attached to and mounted on the board.

The outline of the manufacture of the semiconductor device of the LGA type will be described below.

FIG. 25 shows an example of a lead frame, or "frame," that is conventionally used to produce a semiconductor device. FIG. 26 shows a selected part of the cross section of the semiconductor device that is produced using the frame of FIG. 25.

That is, the frame 205 provides a terminal support portion 251 roughly having a rectangular shape as an outer frame portion thereof. Herein, the prescribed number of inner terminals 202a are arranged along inner sides of the terminal support portion 251; and the prescribed number of outer terminals 202b are arranged along outer sides of the terminal support portion 251. That is, the inner terminals 202a project inwardly from the terminal support portion 251, and the outer terminals 202b project outwardly from the terminal support portion 251, wherein these terminals 202 are mutually interconnected and alternately project in opposite directions. Four stage supports 253 are extended inwardly from four corners of the terminal support portion 251, thus supporting a stage 252 that is arranged in the center area of the frame 205. It may be possible to omit the stage 252 and the stage supports 253 from the frame 205. FIG. 25 shows a typical example of the frame 205 that provides both of them.

A semiconductor chip 101 is fixedly mounted on the stage 252 of the frame 205 together forming a frame assembly. FIG. 26 shows that the semiconductor chip 101 is mounted on the stage 252 in a face-up mode. Herein, pads 101a of the semiconductor chip 101 are connected to backsides of the terminals 202a and 202b by fine lines 103 respectively. When the semiconductor chip 101 is mounted on the stage 252 in a face-down mode, the pads 101a of the semiconductor chip 101 are directly connected to the terminals 202 by solder bumps or solder balls.

Thus, it is possible to provide a frame assembly in which the semiconductor chip 101 is connected to the frame 205. The frame assembly is enclosed or sealed within a resin to form a package 104 under the condition where electrode surfaces 221 of the terminals 202 connected with the external circuit (not shown) are externally exposed. Then, the electrode surfaces 221 of the terminals 202 and the terminal support portion 251 of the frame 205 are both polished and removed by dicing. In this manner, the inner terminal 202a is separated from the outer terminal 202b. In the actual manufacture, there is provided a multiple interconnected frame assembly in which numerous units of the aforementioned frame assembly are interconnected together. Hence, outer peripheries of the outer terminals 202b are subjected to dicing, thus isolating each of the semiconductor devices. Reference symbol DG designates a dicing groove that is formed in the trace of the frame assembly from which the terminal support portion 251 has been removed by polishing.

When connecting the semiconductor device of the LGA type, which is produced as described above, with the external circuit, the lower surface (or mounting surface) of the semiconductor device is soaked into a solder bath, for example, wherein solder fillets are formed on the electrode surfaces 221 of the terminals 202 respectively. In this manner, the terminals 202 of the semiconductor device are connected with the terminals of the external circuit by solder fillets. However, the conventional semiconductor devices have various problems related to soldering. One such problem is caused by an 'exposed' terminal surface 223 of the terminal 202 that is exposed on a cut surface 141, which is formed by dicing the package 104, and is continuously formed in connection with the electrode surface 221. Because of this, when the semiconductor device is soaked into the solder bath, the solder adheres not only to the electrode surface 221 but also to the terminal surface 223, so that, as shown in FIG. 27A, these surfaces are continuously covered with a same solder fillet F. This prevents the constant amount of solder from being normally adhered to each terminal 202. In other words, this may cause deviations for joint strengths in the connection with the external circuit. In addition, the unstable consumption of solder may cause troubles for the production management of semiconductor devices. Another problem related to soldering is caused by the formation of a bridge that connects together the inner terminal 202a and the outer terminal 202b by a same fillet F as shown in FIG. 27B. In addition, a solder bridge may be formed between the terminal 202 and the terminal of the external circuit due to the excessive amount of solder adhering to the terminal 202 of the package 104. A further problem related to soldering is that when the semiconductor device is pulled up as shown in FIG. 27C after connected with the external circuit, the terminals 202 may be easily separated or isolated from the package 104.

Since the 'metal' terminals 202 are connected with the 'resin' package 104, their connecting ability is relatively small. This may cause a separation between the terminals 202 and the package 104 by a prescribed impact due to dicing. This problem may be solved by the technique of Japanese Unexamined Patent Publication No. 2000-286375, which will be described with reference to FIG. 27D. In that technique, the terminal support portion (or interconnecting portion) is removed from the backside of the package in advance, so that terminals (or connecting portions) 210 are isolated from each other; then, projecting portions 224 are provided on opposite side surfaces of the terminals 210, other sides of which are isolated from each other, in order to improve the adhesion between the terminals 210 and the package (or resin sealed member) 104 for the semiconductor device. However, this structure does not eliminate the continuation between the exposed terminal surface and electrode surface of the terminal 210. As a result, the aforementioned publication does not provide effective solutions for the aforementioned problems caused by deviations in the amounts of solder fillets F being adhered to the terminals and by formation of a bridge between the adjoining terminals. In addition, projecting portions cannot be formed on cut surfaces 141 by which the terminals 210 are isolated from each other. This would reduce the joint force effected between the terminals 210 and the package 104. Due to such insufficient joint force, when the semiconductor device is pulled up after connected with the external circuit, it could not avoid the separation between the terminals 210 and the package 104.

SUMMARY OF THE INVENTION

It is an object of the invention to provide a semiconductor package that realizes downsizing thereof by increasing the number of leads without enlarging dimensions thereof.

It is another object of the invention to provide a method of manufacturing semiconductor packages with a high reliability.

It is a further object of the invention to provide a semiconductor device and a manufacturing method therefor in which the prescribed amount of solder can be constantly supplied to electrode surfaces of terminals so as to avoid formation of solder bridges between adjoining terminals, wherein the semiconductor device provides a sufficient resistance against separation between the terminals and the package, regardless of any impact that may occur when removing the terminal support portion by dicing or by a pull-up operation for pulling up the semiconductor device after connection with the external circuit.

A semiconductor package provides outer leads for establishing electrical connections with the substrate in the outer periphery of the bottom thereof. It also provides inner leads for establishing electrical connections with the substrate in the periphery of the stage for supporting a semiconductor chip. The inner leads are formed by short-circuiting pins (e.g., ground pins) having the same potential via the stage, so that the periphery of the stage functions as the leads.

In the above, a lead frame is set into the metal mold, into which a heated resin is injected. The metal mold is clamped in proximity to the outer leads. Thus, the semiconductor package is sealed so as to avoid formation of resin burrs around lower surfaces of the inner leads. Specifically, the inner leads are arranged lower than the outer leads in elevation. Alternatively, a sealing tape is brought into contact with the lower surfaces of the inner leads.

A semiconductor device is produced using a package in which a semiconductor chip mounting on a stage and terminals are embedded within a resin. Herein, pads of the semiconductor chip are respectively connected with terminals by fine lines. Each of the terminals can be modified in structure and configuration. That is, an interconnecting portion like a flange is arranged inside of the resin package at the prescribed elevation above the electrode surface that is exposed on the mounting surface. The interconnecting portion is horizontally elongated so that one terminal surface thereof is exposed to the cut surface, which corresponds to the side wall of the package or the side wall of the dicing groove. In particular, an isolation portion is formed as an integral part of the package made by the resin and is arranged in the prescribed area between the electrode surface and the exposed terminal surface of the interconnecting portion with respect to each terminal. Due to the provision of the isolation portion, it is possible to stabilize amounts of solder adhered to the electrode surfaces. In addition, it is possible to avoid unwanted formation of a solder bridge between the electrode terminal and exposed terminal surface. Further, it is possible to secure a sufficient resistance against the separation of the terminal being peeled off from the package, regardless of any impact that occurs when terminal supports of the frame are cut out and a pull-up operation for pulling up the semiconductor device after connection with the external circuit.

Specifically, it is preferable that the thickness of the isolation portion range from 25% to 75% as compared to the overall thickness of the terminal at its electrode surface. Due to the provision of the isolation portion of adequate size, it is possible to reliably prevent the solder from flowing from the electrode surface to the exposed terminal surface. Hence, it is possible to reliably avoid unwanted formation of a solder bridge between them. The isolation portion is continuously formed as an integral part of the package and is formed to continuously cover the terminal surface between the electrode surface and the exposed terminal surface. For this reason, if the thickness of the isolation portion is less than 25% of the overall thickness of the terminal, the isolation portion may be easily destroyed when a certain tension stress is imparted to the terminal. Hence, it may be impossible to provide sufficient strength for resisting the separation of the terminal from the package. On the other hand, if the thickness of the isolation portion exceeds 75% of the overall thickness of the terminal, the thickness of the interconnecting portion becomes extremely small due to the drawing process for drawing the interconnecting portion deep into the package by etching or polishing. This would result in the unwanted reduction in the strength of the terminal.

The terminal can be further modified to provide a stopper that projects inwardly into the package. The stopper is arranged within the package above the electrode surface, which is exposed on the mounting surface, in such a way that the stopper may cover the overall area of the electrode surface at a different elevation. The side end of the stopper is horizontally elongated to provide an interconnecting portion, which is exposed to the cut surface corresponding to the side wall of the package or the side wall of the dicing groove.

Moreover, at least one electrode surface can be partially deformed to provide a distinction from the other 'normal' electrode surfaces that are arranged on the mounting surface. Alternatively, it is possible to provide an asymmetric arrangement for the electrode surfaces on the mounting surface. Thus, a human operator or optical reader can easily detect the direction of the semiconductor device to be connected with the external circuit.

BRIEF DESCRIPTION OF THE DRAWINGS

These and other objects, aspects, and embodiments of the present invention will be described in more detail with reference to the following drawing figures, in which:

FIG. 13A is a sectional view showing a terminal and its peripheral elements in a package for use in a semiconductor device that is produced in accordance with a fourth embodiment of the invention;

FIG. 13B is a plan view showing the terminal and its peripheral elements that are viewed from the electrode surface of the terminal shown in FIG. 13A;

FIG. 14 is a sectional view showing selected parts of a semiconductor device in accordance with a fifth embodiment of the invention;

DESCRIPTION OF THE PREFERRED EMBODIMENT

This invention will be described in further detail by way of examples with reference to the accompanying drawings.

First Embodiment

Figure 1A:
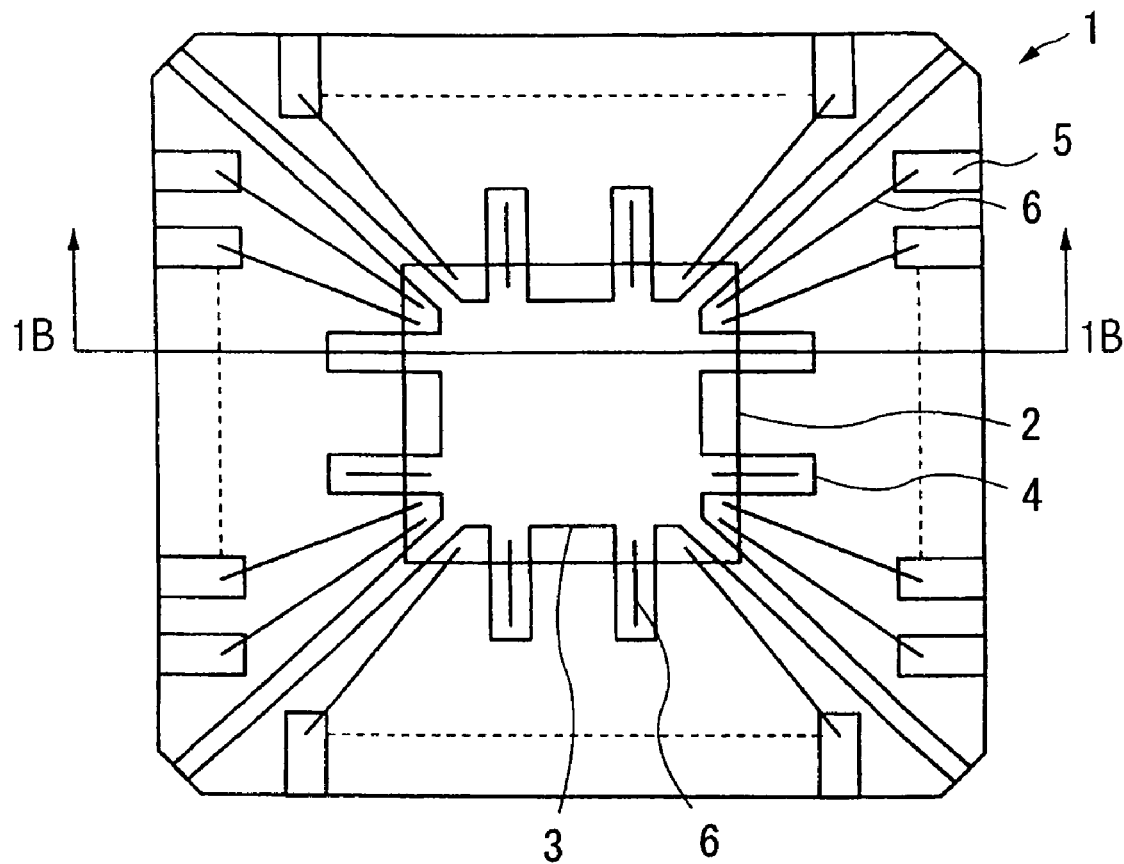
FIG. 1A is a plan view showing the upper appearance of a semiconductor package in accordance with a first embodiment of the invention.
Figure 1B:
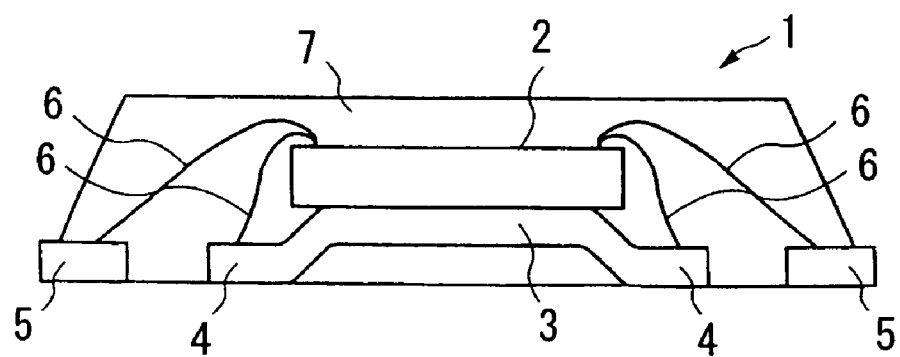
FIG. 1B is a sectional view of the semiconductor package taken along line 1B-1B in FIG. 1A.

FIGS. 1A and 1B show the structure and internal configuration of a semiconductor package 1 in accordance with a first embodiment of the invention. Specifically, FIG. 1A is a plan view showing the upper appearance of the semiconductor package 1; and FIG. 1B is a sectional view of the semiconductor package 1 taken along line 1B-1B in FIG. 1A.

Reference numeral 2 designates a semiconductor chip, which is supported by a stage 3. Reference numeral 4 designate inner leads that are arranged in the periphery of the stage 3; and reference numeral 5 designate outer leads that are arranged in the outer periphery of the semiconductor package 1 in its bottom. The inner leads 4 and the outer leads 5 are electrically connected together with bonding pads on the semiconductor chip 2 via metal fine lines 6. The aforementioned semiconductor chip 2, stage 3, inner leads 4, and outer leads 5 are all enclosed or sealed within a resin 7, together forming the package 1.

Compared to the normal QFN package, the semiconductor package 1 provides the inner leads 4 in the periphery of the stage 3 in addition to the outer leads 5. The inner leads 4 are formed by short-circuiting the same potential pins such as ground pins (not shown) via the stage 3, so that the periphery of the stage 3 functions as the leads. By the provision of the inner leads 4 that can be primarily used as ground terminals, it is possible to reduce the total number of the outer leads 5 that are formed in the outer periphery of the semiconductor package 1. Thus, it is possible to increase the total number of leads provided for the semiconductor package 1 while maintaining substantially the same size for the semiconductor package 1 without increasing the resin sealed area. All the inner leads 4 can be used at the same potential.

By the provision of the inner leads 4 in the periphery of the stage 3, it is possible to increase the total number of leads provided for the semiconductor package 1 while maintaining substantially the same size for the semiconductor chip 1. Thus, it is possible to realize the downsizing of the semiconductor package 1.

Next, a method for manufacturing the semiconductor package 1 will be described in accordance with the present embodiment of the invention.

The lower surfaces of the inner leads 4 and outer leads 5 may act as external electrodes allowing electrical connections with the substrate. When enclosing them in the resin 7, it is necessary not to form resin burrs around the lower surfaces of the inner leads 4 and outer leads 5. A method of manufacturing a semiconductor package without causing formation of resin burrs will be described with reference to FIG. 2.

Figure 2:
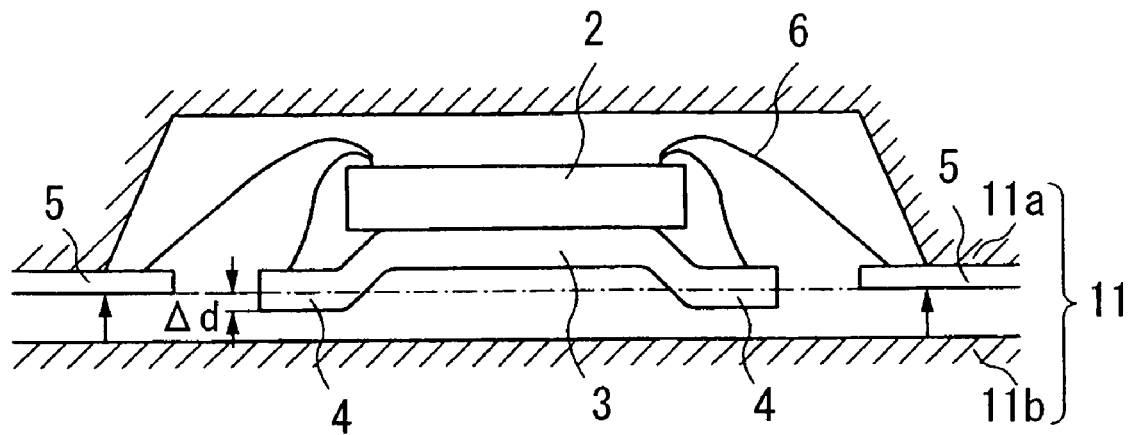
FIG. 2 is a sectional view showing an internal structure of a semiconductor package in accordance with a first modification of the first embodiment of the invention.

In FIG. 2, a metal mold 11 consists of an upper mold 11a and a lower mold 11b. A lead frame that is completed in bonding is set into the metal mold 11, into which the heated resin 7 is injected. In a sealing step of the semiconductor package 1, the outer lead 5 is placed in proximity to the prescribed position that is sandwiched between the upper mold 11a and the lower mold 11b of the metal mold 11. At this position, the metal mold 11 performs clamping relatively strongly. Therefore, substantially no resin burr may be formed around the lower surface of the outer lead 5.

In contrast to the outer lead 5, the inner lead 4 is placed far from the prescribed position sandwiched between the upper mold 11a and lower mold 11b of the metal mold 11, so that it would not be directly clamped by the metal mold 11. In the sealing step of the semiconductor package 1, the inner lead 4 is pushed inwardly to cause resin burrs being formed in the lower side of the inner lead 4. In order to avoid formation of resin burrs, the inner lead 4 is lowered in advance in elevation by Δd compared to the outer lead 5. In other words, a prescribed offset is set to the inner lead 4 compared to the outer lead 5. Then, the lead frame is enclosed or sealed within the resin 7 in the clamped state of the metal mold 11 consisting of the upper mold 11a and lower mold 11b.

That is, the manufacturing method of the present embodiment is characterized by introducing the prescribed positional relationship by which the inner lead 4 is lowered in position compared to the outer lead 5, such that the lead frame is enclosed or sealed within the resin 7 under the clamped state of the metal mold 11. This ensures that the inner lead 4 will be reliably brought into connection with the lower mold 11b. Therefore, it is possible to avoid formation of resin burrs around the lower surface of the inner lead 4. Thus, it is possible to realize a method for manufacturing semiconductor packages that can reliably establish electrical connections with substrates with a high reliability.

Next, another example of the method for manufacturing semiconductor packages without causing formation of resin burrs will be described with reference to FIG. 3.

Figure 3:
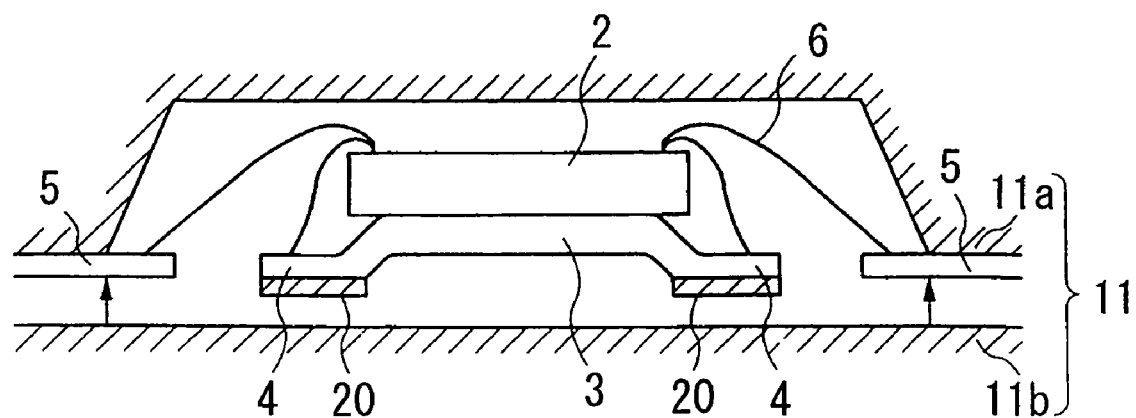
FIG. 3 is a sectional view showing an internal structure of a semiconductor package in accordance with a second modification of the first embodiment of the invention.

In FIG. 3, a sealing tape 20 is brought into contact with the lower surface of the inner lead 4, and then the lead frame is set into the metal mold 11, wherein the heated resin 7 is injected into the metal mold 11. The sealing tape 20 is made using the prescribed resin base, which may be basically composed of polyimide, polyethylene terephthalate, polycarbonate, and the like. It is required that the sealing tape 20 can be easily peeled off after the resin sealing and provide a sufficient resistance against high temperature environments during the resin sealing. The sealing tape 20 can prevent the resin from entering about the lower surface of the inner lead 4 during the resin sealing. Thus, it is possible to avoid unwanted formation of resin burrs in the semiconductor package.

The aforementioned example shows that the sealing tape 20 is brought into contact with the lower surface of the inner lead 4 only. It is possible to bring the sealing tape 20 in contact with the lower surface of the outer lead 5 in addition to the lower surface of the inner lead 4.

That is, the aforementioned example performs the resin sealing under the condition where the sealing tape 20 is brought into contact with the lower surface of the inner lead 4. Hence, it is possible to realize a manufacturing method for reliably manufacturing semiconductor packages, which can provide electrical connections with substrates with a high reliability, without causing unwanted formation of resin burrs around lower surfaces of inner leads.

The first embodiment of the invention provides a variety of technical features and effects, which will be summarized below.

(1) Inner leads are additionally provided in the periphery of the stage of the lead frame, thus adequately increasing the number of leads while maintaining substantially the same size with respect to the semiconductor package, making it possible to realize downsizing of the semiconductor package.

(2) The inner leads are arranged lower than the outer leads in elevation; and then, the outer leads are clamped by the metal mold, wherein the lead frame is enclosed or sealed within the resin, making it possible to provide a manufacturing method for reliably manufacturing semiconductor packages, which can establish electrical connections with substrates with a high reliability, without causing unwanted formation of resin burrs around lower surfaces of inner leads.

(3) The resin sealing is performed under the condition where a sealing tape is brought into contact with the lower surface of the inner lead, making it possible to provide a manufacturing method for reliably manufacturing semiconductor packages, which can establish electrical connections with substrates with a high reliability, without causing unwanted formation of resin burrs around lower surfaces of inner leads.

Second Embodiment

Figure 4:
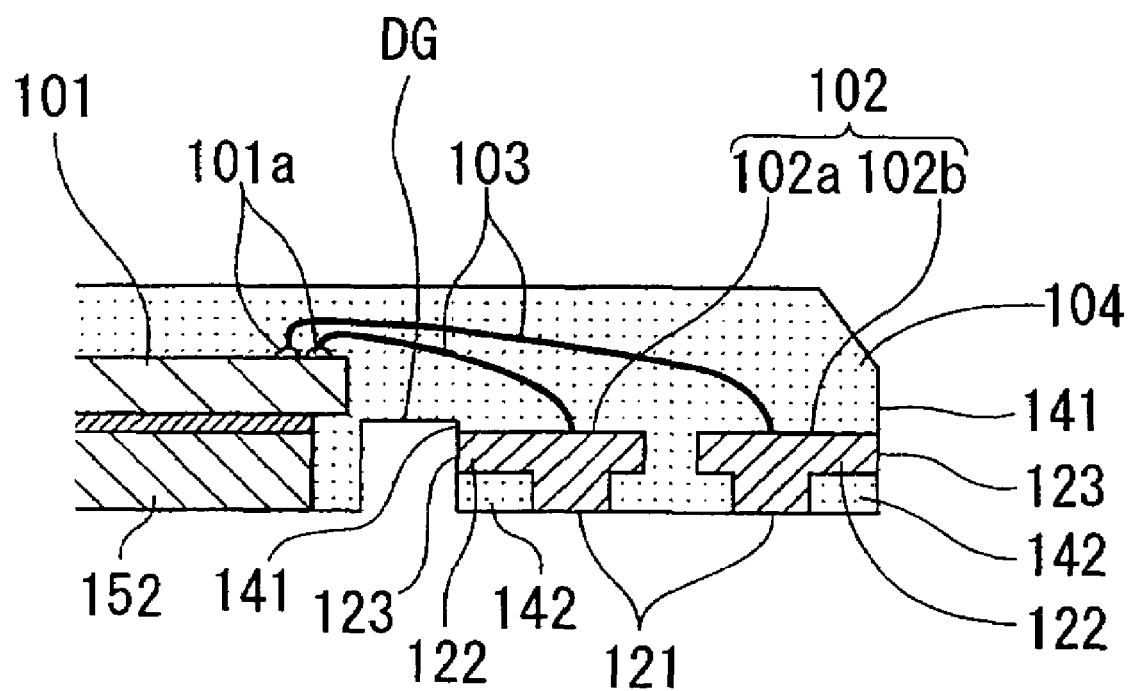
FIG. 4 is a sectional view showing selected parts of a semiconductor device in accordance with a second embodiment of the invention.
Figure 5:
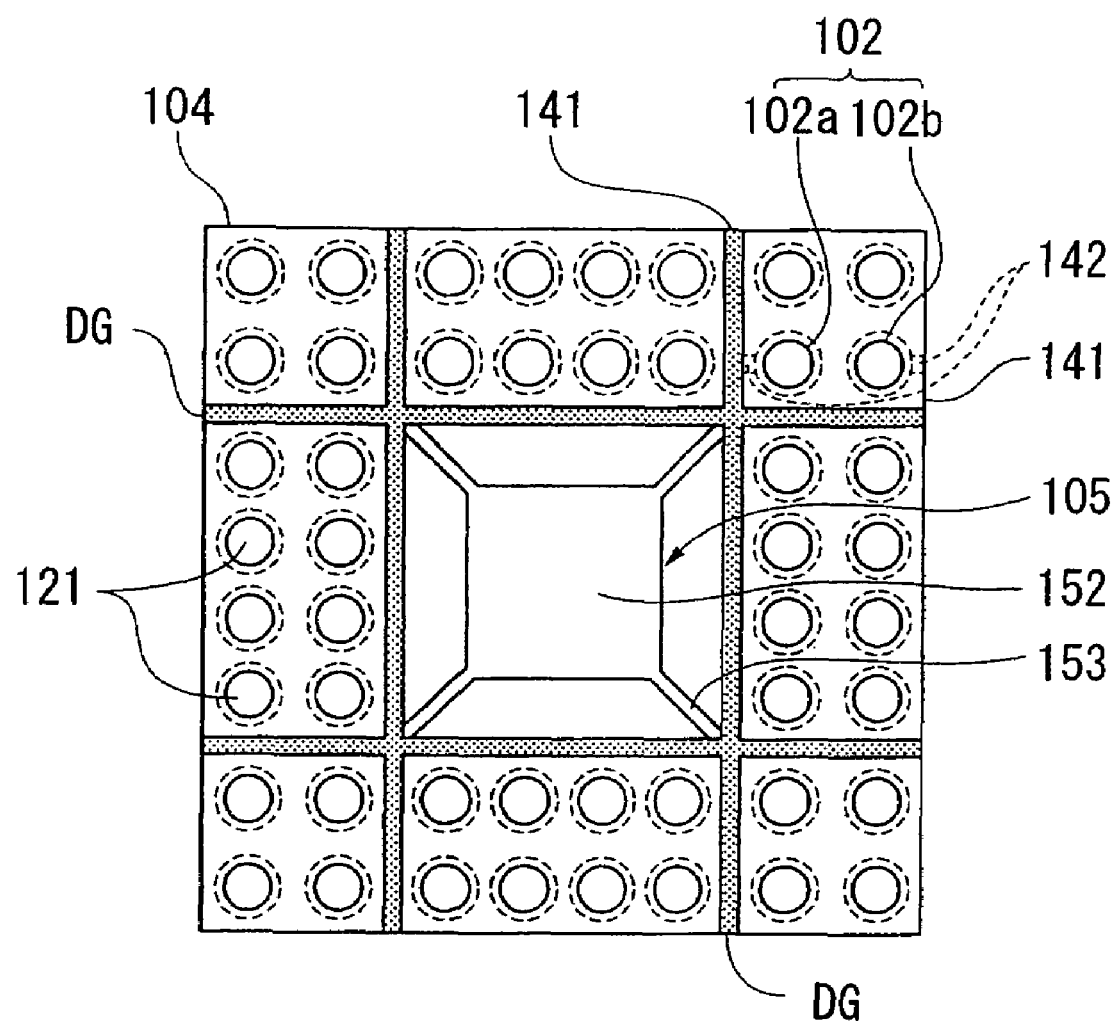
FIG. 5 is a plan view showing the appearance of the mounting surface of the semiconductor device.

FIG. 4 is a sectional view showing selected parts of a semiconductor device in accordance with a second embodiment of the invention. FIG. 5 is a plan view showing an appearance of the semiconductor device that is viewed from its backside (or mounting surface), wherein electrode surfaces are formed to establish connections using external lines.

In the semiconductor device of the second embodiment, pads 101a of a semiconductor chip 101 are electrically connected to terminals 102 via fine lines 103. Herein, the terminals 102 contain inner terminals 102a and outer terminals 102b, which are respectively aligned in an inner line and an outer line in the periphery of a package 104. Both the inner terminal 102a and outer terminal 102b provide electrode surfaces 121, which are exposed externally. The aforementioned elements such as the semiconductor chip 101 and terminals 102 are enclosed or sealed within the package 104 that is composed of a thermosetting resin compound (hereinafter, simply referred to as a resin). The 'exposed' electrode surfaces 121 constitute solder ports that are used to mount the semiconductor device on the circuit board (not shown). In the present embodiment, each of the electrode surfaces 121 has a circular shape.

On the mounting surface of the package 104 shown in FIG. 5, a stage 152 for mounting the semiconductor chip 101 is arranged in an exposed manner substantially at the center of the semiconductor device. In addition, the stage 152 is supported by stage supports 153 at four corners respectively. The peripheral area of the mounting surface of the package 104, outside of the stage 152, is partitioned into the prescribed number of areas to provide double alignment of the 'circular' electrode surfaces 121, which correspond to the inner terminals 102a and the outer terminals 102b respectively. Specifically, four dicing grooves DG are formed by dicing to cross with each other in a well crib manner in the outer periphery of the stage 152, wherein they are extended towards side ends of the package 104. The dicing grooves DG and the electrode surfaces 121 are arranged to be mutually separated from each other by the prescribed distance. Side walls of each dicing groove DG constitute cut surfaces 141 that are perpendicular to the mounting surface (or horizontal plane). In addition, side walls of the package 104 constitute cut surfaces 141 that are perpendicular to the mounting surface.

As shown in FIG. 4, each of the terminals 102 provides a projecting portion (or an interconnecting portion) 122 that is horizontally projected towards the cut surface 141. Thus, the interconnecting portion 122 provides a terminal surface (or an exposed surface) 123 that is exposed in the cut surface 141. Herein, the interconnecting portion 122 is horizontally extended compared to the electrode surface 121 in the package 104. Details for the formation of the interconnecting portions 122 will be described later in relation to the manufacturing method of the semiconductor device. In short, they are formed as the result of the dicing for cutting and removing the terminal supports for supporting the terminals 102 that are interconnected by the interconnecting portions 122. Further, an isolation portion 142 that is composed of a resin and is integrally formed together with the package 104 is formed in the prescribed area between the electrode surface 121 and exposed terminal surface 123 of the terminal 102.

Figure 6A:
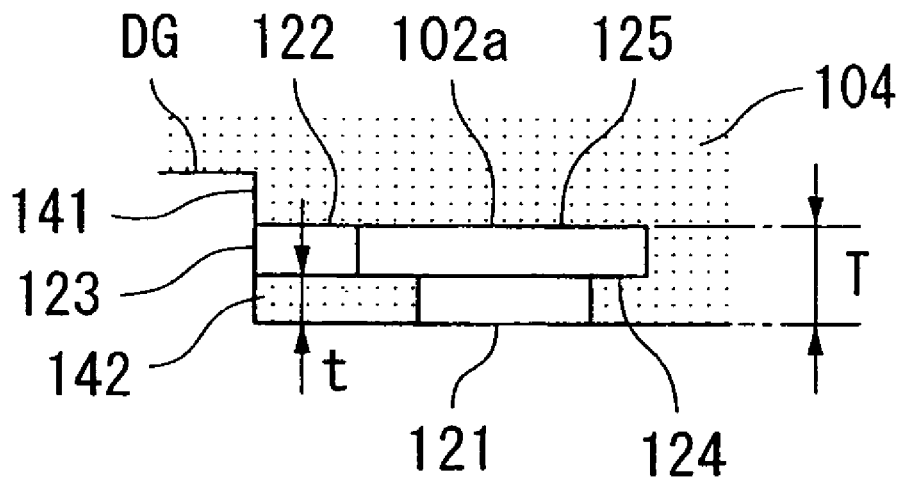
FIG. 6A is a sectional view diagrammatically showing an inner terminal and its peripheral parts embedded in a package.
Figure 6B:
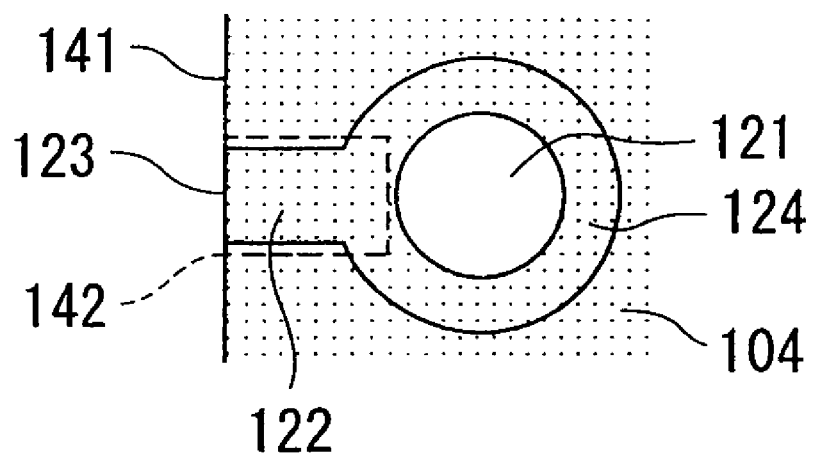
FIG. 6B is a plan view showing selected parts relating to the inner terminal, which is viewed from its electrode surface.

FIGS. 6A and 6B show relationships between the terminal 102 and its peripheral elements in the package 104. For the sake of, these figures show the inner terminal 102a and its peripheral elements. Of course, the peripheral structure of the inner terminal 102a can be similarly applied to the outer terminal 102b. Specifically, FIG. 6A is a side view for the inner terminal 102a, and FIG. 6B is a plan view for the peripheral elements of the inner terminal 102a, which is viewed from the electrode surface 121. The inner terminal 102a is composed of an electrode surface 121 having a circular shape in plan view, a stopper (or terminating portion) 124, an interconnecting portion 122, and an exposed terminal surface 123. Herein, the stopper 124 is formed above the electrode surface 121 by a thickness t within the package 104, wherein it is broadened like a flange to encompass the overall area of the electrode surface 121 at a different elevation. The interconnecting portion 122 is horizontally extended from the side end of the stopper 124 towards the cut surface 141 corresponding to the side wall of the dicing groove DG. The side end of the interconnecting portion 122 is exposed on the cut surface 141 as the exposed terminal surface 123. Most of the parts of the inner terminal 102, except the electrode surface 121 and the exposed terminal surface 123, are embedded in the package 104. The isolation portion 142 is an integral part of the package 104 for isolating the electrode surface 121 from the exposed terminal surface 123. The thickness t of the isolation portion is about 50% of the total thickness T of the inner terminal 102a. The electrode surface 121 is plated, which is not specifically shown in FIGS. 6A and 6B.

In the semiconductor device of the present embodiment, each of the terminals 102 (i.e., the inner terminal 102a and outer terminal 102b) provides the 'resin' isolation portion 142 by which the electrode surface 121 is isolated from the exposed terminal surface 123 that is exposed on the cut surface 141 of the package 104. Therefore, when a solder is adhered to the electrode surface 121 in order to install the semiconductor device being connected with the external circuit on the board, for example, a solder fillet must be formed only on the electrode surface 121; in other words, it is possible to prevent the solder from partially flowing from the electrode surface 121 to the exposed terminal surface 123. This provides the constant soldered joint strength between the semiconductor device and external circuit with respect to each terminal. Hence, it is possible to avoid occurrence of an unwanted dispersion in quality of products. In addition, it is possible to make the consumption of solder being adhered to each terminal of the semiconductor device constant. The aforementioned matters may bring noticeable advantages in the product management for semiconductor devices. Further, it is possible to avoid formation of a bridge between the adjoining electrode terminals 121. This brings noticeable reduction in occurrence of soldering defectiveness, which could improve the yield in the production of semiconductor devices.

In the semiconductor device of the present embodiment, the isolation portion 142 may adequately depress the interconnection portion 122 so as to prevent it from floating up in the package 104, thus making it difficult for the terminal 102 to be easily peeled off from the package 104. Due to the provision of the stopper 124 that, like a flange, horizontally projects in the peripheral area of the electrode 121 within the package 104, it is possible to provide a resistance for the terminal 102 to be peeled off. Thus, it is possible to reliably prevent the terminal 102 from being peeled off from the package 104, regardless of an impact that occurs when the terminal supports are removed by cutting in the manufacturing process as well as a pull-up operation for pulling up the semiconductor device after connected with the external circuit.

The manufacturing method for manufacturing the semiconductor device of the present embodiment basically contains five processes, which will be described with reference to FIG. 7.

Figure 7:
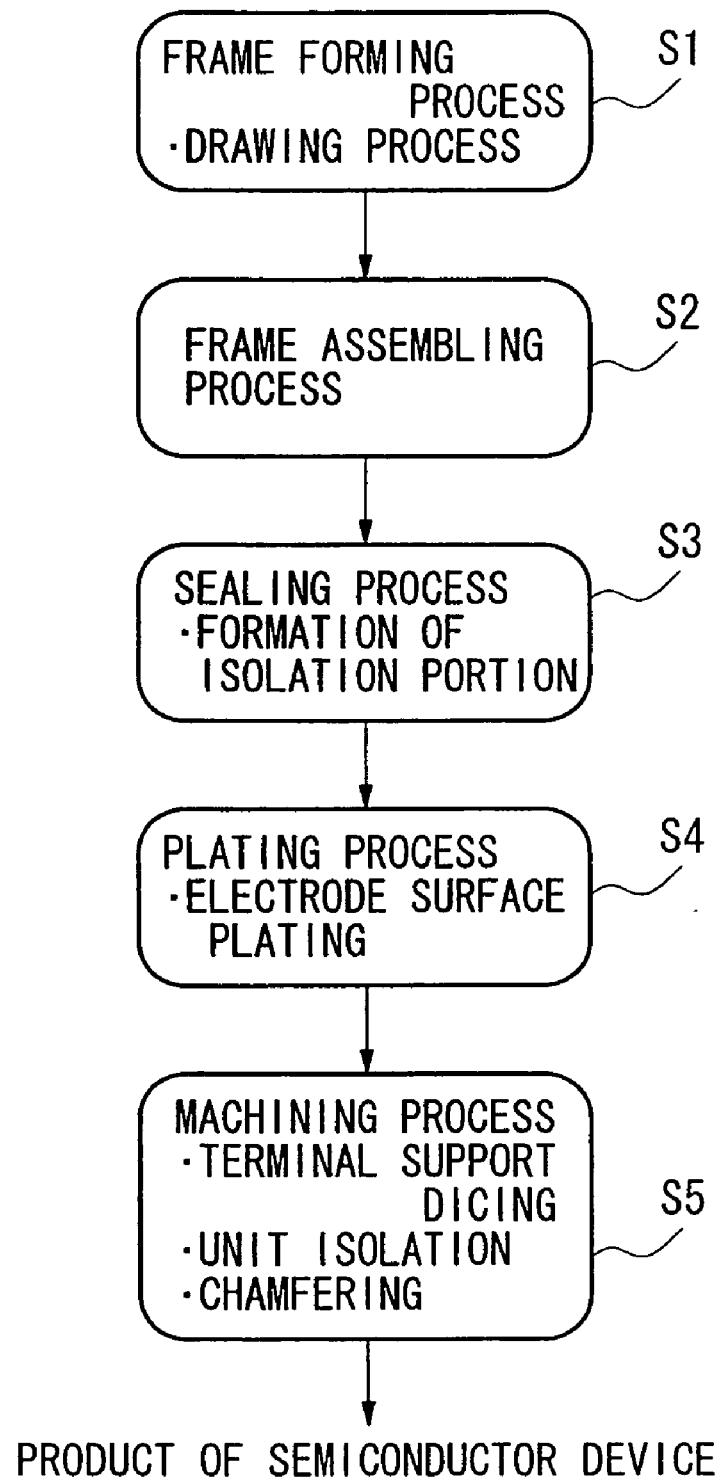
FIG. 7 is a process diagram showing five processes in the manufacture of a semiconductor device in accordance with the second embodiment of the invention.

That is, the manufacturing process shown in FIG. 7 is basically composed of the following five steps, namely, the frame forming process, the frame assembling process, the sealing process, the plating process, and the machining process (or cutting process).

(1) Frame Forming Process (S1)

Figure 8:
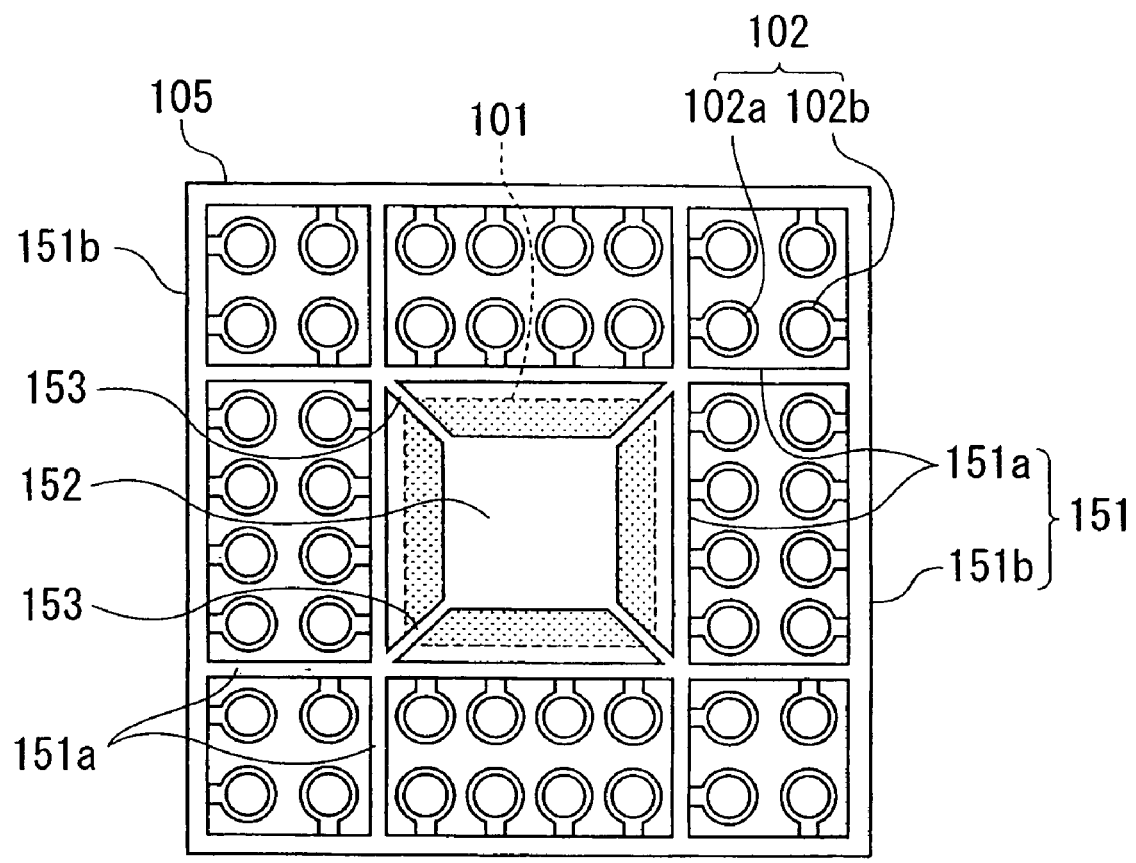
FIG. 8 is a plan view showing the appearance of one unit of a lead frame, which is viewed from the mounting surface of the semiconductor device.

FIG. 8 shows one unit of the lead frame that is formed in the frame forming process in step S1, wherein this frame is viewed the mounting surface of the semiconductor device in plan view. The actually manufactured multiple interconnected frame assembly contains numerous units of lead frames, each having the same size and shape, that are horizontally arranged and interconnected together. In FIG. 8, reference numeral 105 designates one unit of the frame. The lead frame 105 as a whole is made by a metal plate having an externally square shape. A stage 152 for mounting a semiconductor chip 101 thereon is formed substantially at the center of the 'square' frame 105. Four terminal supports 151a for connecting inner terminals 102a are arranged in a well crib manner in the peripheral area of the stage 152, wherein they are extended towards side ends of the frame 105. Four terminal supports 151b for connecting outer terminals 102b are arranged to encompass the frame 105 at its four side ends. That is, the four terminal supports 151b construct the outer frame. In addition, four stage supports 153 are extended from four intersecting points between the four terminal supports 151a towards four corners of the stage 152. Thus, the stage 152 is supported by the four stage supports 153.

Next, the drawing process is performed on the frame 105, wherein the interconnecting portion 122 and the stopper 124 are drawn into the package 104 to become higher than the electrode surface 121 and the terminal support 151 with respect to each terminal 102. Specifically, the present embodiment performs the drawing process by etching using photolithography.

Figure 9:
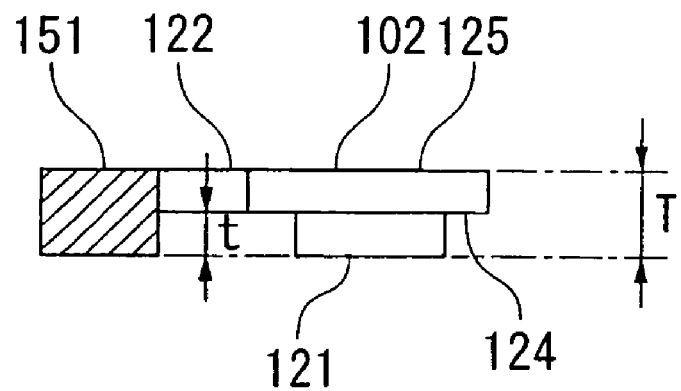
FIG. 9 is a simplified drawing showing an assembly of parts regarding the terminal after the drawing process.

FIG. 9 is a side view diagrammatically showing the overall structure of the terminal 102 after completion of the drawing process. Herein, the terminal 102 is interconnected with the terminal support 151 via the interconnecting portion 122, wherein the interconnecting portion 122 is drawn into the package 104 by the prescribed depth t from the level of the electrode surface 121 and terminal support 151. As a result, the thickness of the terminal 102 is defined as approximately 50% of the original thickness T of the frame 105.

(2) Frame Assembling Process

The semiconductor chip 101 is mounted on the backside of the stage 152, which is opposite to the mounting surface, in the face-up mode. Then, one ends of fine lines are joined to pads 101a of the semiconductor chip 101, while other ends are joined to backsides of the terminals 102. In this manner, the frame assembly is completely produced.

(3) Sealing Process

The details of the sealing process will be described with reference to FIG. 7, which is a sectional view showing selected parts of one unit of the frame assembly. Actually, numerous units of the frame assemblies are horizontally arranged and interconnected together to form a multiple interconnected frame assembly. Herein, the frame assembly is installed in a mold 111 consisting of divided molds 111a and 111b. A resin is filled into the cavity of the mold 111 and is then hardened. Thus, it is possible to form the overall structure of packages, each of which is used to encapsulate each frame assembly unit. In the sealing process, the resin is also filled into certain gaps that are formed by the drawing process of the frame 105. Hence, it is possible to form isolation portions 142, which are integrally formed together with other parts of the package 104 by the resin.

By ejecting the hardened product from the mold 111, it is possible to obtain a continuity of numerous units of the semiconductor devices. In such a continuity, the electrode surface 121, terminal supports 151a, 151b, stage supports 153, and stage 152 are all exposed in the mounting surface with respect to each unit of the semiconductor device.

(4) Plating Process

Next, the mounting surface of the semiconductor device is subjected to plating. Thus, it is possible to form plated layers on exposed portions such as the electrode surfaces 121 of the semiconductor device.

(5) Machining Process

Figure 10:
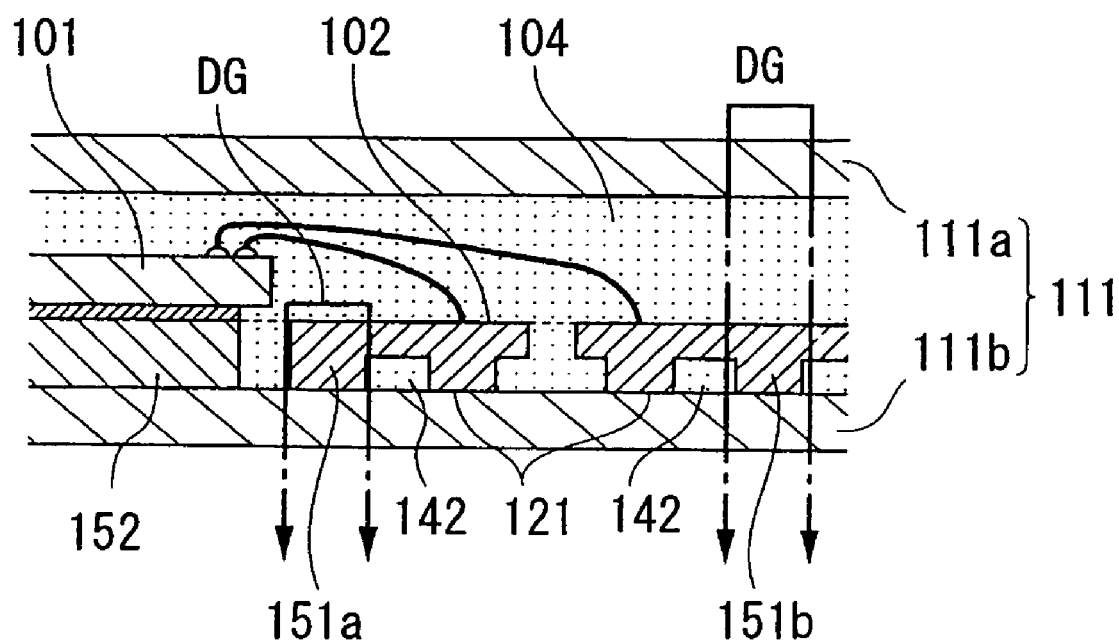
FIG. 10 is a sectional view showing selected parts of a frame assembly for explaining the sealing process.
Figure 11:
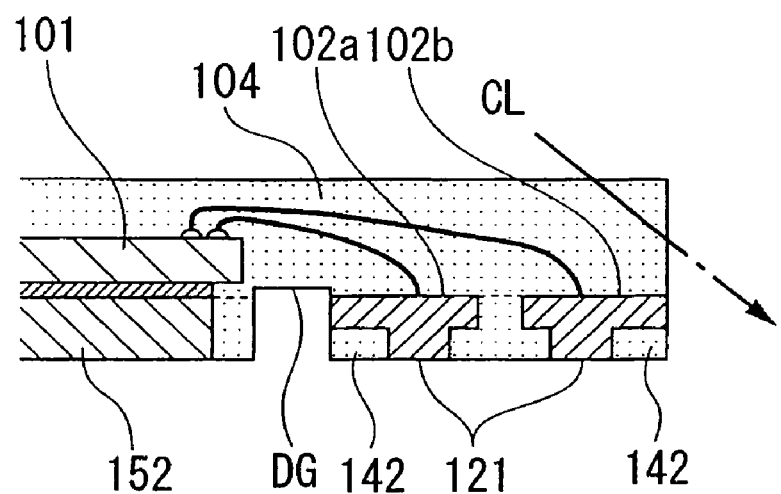
FIG. 11 is a sectional view showing selected parts of a semiconductor device for explaining the cutting process that is effected on the frame assembly shown in FIG. 10.

The continuity of numerous units of the semiconductor devices are subjected to machining or cutting process, wherein selected parts are cut out as shown by dashed lines in FIG. 10. Thus, dicing grooves DG are formed. FIG. 11 is a sectional view used for explaining the cutting process. First, the terminal supports 151a that are exposed in the mounting surface are cut out and removed by half dicing. Thus, it is possible to form the aforementioned dicing grooves DG shown in FIGS. 5 and 11. Next, the other terminal supports 151b, which are exposed to encompass four side ends of the frame unit, are cut out and removed by full dicing. Thus, it is possible to remove the terminal supports 151b from the mounting surface, so that the cut surfaces 141 surrounding the semiconductor device are formed. As a result, each unit of the semiconductor device is isolated from the others. Incidentally, it is possible to perform slanted polishing along the cutting line CL with respect to each corner of the package 104 to chamfer as necessary. Thus, it is possible to completely produce the semiconductor device whose configuration is shown in FIG. 4.

Third Embodiment

Next, a semiconductor device of a third embodiment of the invention will be described with reference to FIG. 12, wherein the third embodiment is substantially similar to the foregoing second embodiment except for the designated structure for the lead frame 105. Hence, the third embodiment is described with respect to only the structure of the frame 105.

Figure 12:
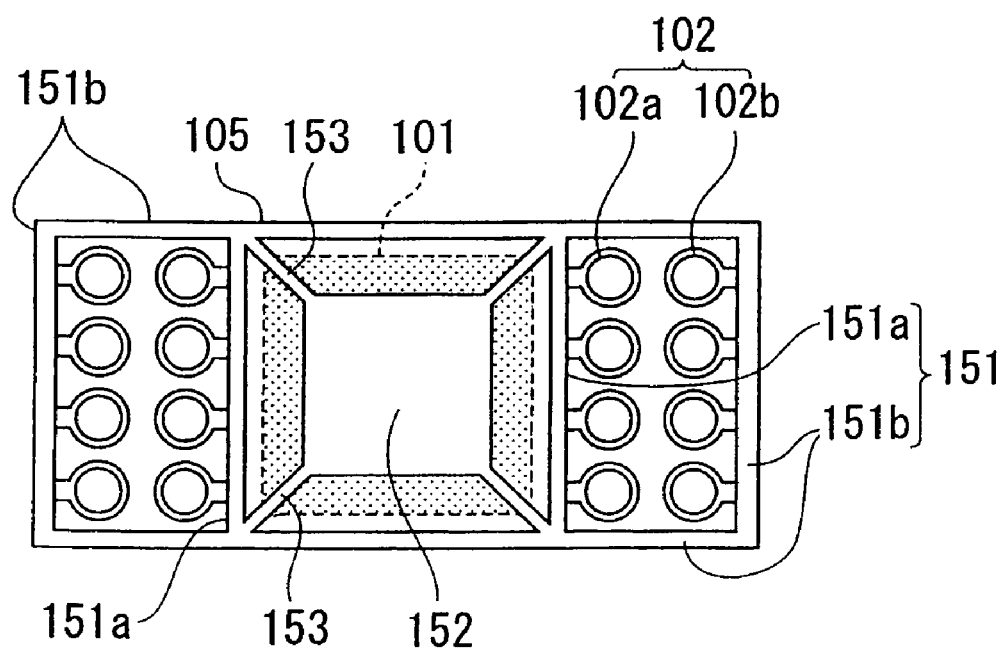
FIG. 12 is a plan view showing the appearance of one unit of a lead frame, which is viewed from the mounting surface of a semiconductor device in accordance with a third embodiment of the invention.

FIG. 12 is a plan view showing the appearance of one unit of the frame 105, which is viewed from its mounting surface and is used to manufacture the semiconductor device of the third embodiment. Actually, as has been described above numerous units of the frames 105 are horizontally arranged and interconnected together.

In FIG. 12, the lead frame 105 is made by a metal plate having a substantially externally rectangular shape. A stage 152 for mounting a semiconductor chip 101 is formed substantially at the center of the 'rectangular' frame 105. A pair of terminal supports 151a, each of which connects together the prescribed number of inner terminals 102a, are arranged in parallel and along with two opposite sides of the stage 152 roughly having a square shape in plan view. Two pairs of terminal supports 151b are arranged along four side ends of the frame 105, thus forming an outer frame encompassing the rectangular frame 105. Among them, a pair of the 'short' terminal supports 151b are arranged along a pair of opposite short sides of the frame 105, wherein each of them connects together the prescribed number of outer terminals 102b. Both ends of the terminal supports 151a intersect with prescribed intermediate positions of the 'long' terminal supports 151b, thus forming four intersecting points therebetween. Four stage supports 153 are extended inwardly from the four intersecting points towards the four corners of the stage 152. Therefore, the stage 152 is reliably supported by the stage supports 153 at the four corners thereof. Incidentally, each of the terminals 102 is identical to the foregoing one used in the second embodiment.

In the frame assembling process, the semiconductor chip 101 is mounted on and bonded to the stage 152 of the frame 105 in a face-up mode; then, the pads of the semiconductor chip 101 are respectively connected with the terminals 102 by fine lines, so that a frame assembly is produced. In the sealing process, the frame assembly is installed in the previously described mold having a cavity, into which a resin is filled and is then hardened. A hardened product is ejected from the mold, wherein its mounting surface provides the terminal supports 151a and 151b that are exposed. The terminal supports 151a are cut out and removed by half dicing; and the other terminal supports 151b, which are exposed to encompass four side ends of the frame 105, are cut out and removed by full dicing. It is necessary to cut out corners of the package along slanted cutting lines, so that the package is chamfered as necessary. Thus, it is possible to completely produce a semiconductor device substantially having a rectangular shape, wherein the terminals 102 are arranged in two extended sides of the mounting surface.

Fourth Embodiment

Next, a semiconductor device of a fourth embodiment of the invention will be described with reference to FIGS. 13A and 13B, wherein the fourth embodiment is substantially similar to the foregoing second embodiment except the designated configuration of a terminal 102. Hence, the fourth embodiment is described with respect to only the terminal 102.

FIGS. 13A and 13B show a terminal 102 and its peripheral elements embedded in the package 104 in accordance with the fourth embodiment of the invention. Specifically, FIG. 13A is a sectional view showing the terminal 102 and its peripheral elements in the package 104; and FIG. 13B is a plan view that is viewed from an electrode surface 121 of the terminal 102. The terminal 102 provides a recess 126 at a back portion 125. A projecting portion 143 that is an integral part of the package 104 engages with the recess 126. Therefore, the semiconductor device of the fourth embodiment provides a stopper or an anchor, which is realized by an engagement of the recess 126 of the terminal 102 and the projection 143 of the package 104. Due to the provision of the stopper, it is possible to increase the resistance against the separation of the terminal 102 to be peeled off from the package 104. In contrast to the foregoing second embodiment shown in FIGS. 6A and 6B, the terminal 102 of the fourth embodiment shown in FIGS. 13A and 13B does not provide the stopper 124 like the flange. Therefore, it is possible to reduce the total size of the terminal 102 in the fourth embodiment compared to the second embodiment. Thus, it is possible to arrange a great number of terminals 102 on the mounting surface having a limited area in a concentrated manner.

Fifth Embodiment

Next, a semiconductor device of a fifth embodiment of the invention will be described with reference to FIGS. 14 and 15.

Figure 15:
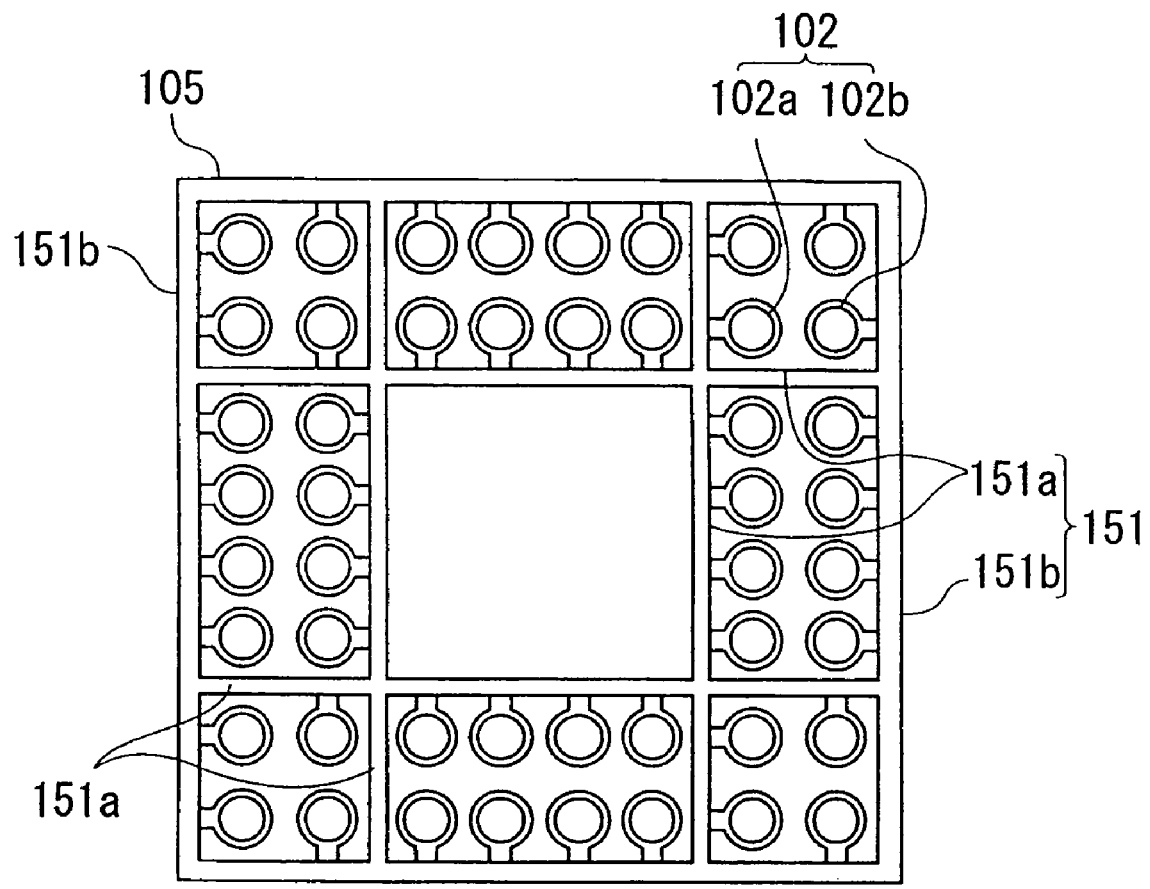
FIG. 15 is a plan view of one unit of a lead frame that is viewed from the mounting surface and is used to produce the semiconductor device of the fifth embodiment.

Specifically, FIG. 14 is a sectional view showing selected parts of the semiconductor device in accordance with the fifth embodiment of the invention; and FIG. 15 is a plan view of one unit of a frame that is viewed from the mounting surface and is used to produce the semiconductor device of the fifth embodiment. In short, the fifth embodiment provides a semiconductor device in which a semiconductor chip 101 is mounted in a face-down mode to provide electrical connections with terminals 102.

In the semiconductor device of the fifth embodiment shown in FIG. 14, the semiconductor chip 101 is mounted face-down, so that pads 101a are directly connected to the terminals 102 by solder balls. Most of the parts of the semiconductor device such as the semiconductor chip 101 and terminals 102 are enclosed and sealed within a resin package 104. The fifth embodiment does not require the stage for mounting the semiconductor chip 101 thereon.

As to the configuration of the terminal 102, the fifth embodiment is substantially identical to the second embodiment. That is, each of the terminals 102 provides an electrode surface 121, a stopper 124, an interconnecting portion 122, and an exposed terminal surface 123. Herein, the stopper 124 is drawn into the package 104 and is arranged above the electrode surface 121, wherein it acts like a flange for completely encompassing the electrode surface 121 at a different elevation. The interconnecting portion 122 is extended from the side end of the stopper 124 towards a cut surface 141, which corresponds to the side wall of a dicing groove DG or the side wall of the semiconductor device. The terminal surface of the interconnecting portion 122 is exposed on the cut surface 141 of the package 104 as the exposed terminal surface 123. Most of the related elements of the terminal 102 are embedded in the package 104 except the electrode surface 121 and exposed terminal surface 123. In addition, an isolation portion 142 is formed as an integral part of the package 104 and is arranged in the prescribed area between the electrode surface 121 and exposed terminal surface 123. The dicing groove DG is formed as the result of the dicing by which terminal supports are cut out and removed in the production of the semiconductor device of the fifth embodiment.

As described above, the semiconductor device of the fifth embodiment is designed in such a way that the electrode surface 121 of the terminal 102 is isolated from the exposed terminal surface 123, which is exposed on the cut surface of the package 104, by the isolation portion 142 that is made by the resin. Therefore, when solder is adhered to the electrode surface 121, a solder fillet is formed on the electrode surface 121 only and would not be extended from the electrode surface 121 to the exposed terminal surface 123. That is, it is possible to avoid formation of an unwanted connection between the electrode surface 121 and the exposed terminal surface 123 by the solder fillet. This ensures the constant joint strength to be applied to each terminal in soldering when the semiconductor device is electrically connected with the external circuit. Therefore, it is possible to eliminate deviations in the quality of products. In addition, the present embodiment can provide some advantages in the production management because of the constant consumption in the amount of solder adhered to terminals. Further, it is possible to avoid unwanted formation of a solder bridge between the electrode surface 121 and exposed terminal surface 123 with respect to each terminal 102. This would noticeably reduce the defectiveness in soldering, thus improving the yield in the production of semiconductor devices.

In the semiconductor device of the fifth embodiment, the isolation portion 142 depresses the interconnecting portion 122 not to float up in the package 104. Hence, the terminal 102 will hardly be separated from the package 104. In addition, the fifth embodiment provides the stopper 124 that is projected inside of the package 104 like a flange, which encompasses the periphery of the electrode surface 121 at the different elevation. This further improves the resistance against the separation between the terminal 102 and package 104. That is, it is possible to reliably prevent the terminal 102 from being peeled off from the package 104, regardless of any impact that may occur when the terminal supports are cut out and removed in the production process or a pull-up operation for pulling up the semiconductor device after connected with the external circuit. One of the important features of the fifth embodiment is the arrangement of the semiconductor chip 101 in a face-down manner so that its pads are directly connected with the terminals 102 by solder. In this manner, the terminals 102 can be concentrically arranged within the projected area of the semiconductor chip 101. This ensures a compact size for the semiconductor device.

Next, the manufacturing method for manufacturing the semiconductor device of the fifth embodiment will be described below.

First, a lead frame 105 shown in FIG. 15 is formed in the frame forming process. As compared to the foregoing frame 105 of the second embodiment shown in FIG. 8, the frame 105 of the fifth embodiment shown in FIG. 15 does not provide the stage 152 or its stage supports 153. The frame 105 is subjected to the drawing process by a photolithography with respect to the interconnecting portion 122 and the stopper 124. In the frame assembling process, the semiconductor chip 101 is arranged face-down, so that its pads 101a are connected with the terminals 102 respectively. Thus, a frame assembly is produced. In the sealing process, the frame assembly (actually, numerous units of the frame assemblies) is installed in the mold that is composed of divided molds and provides a cavity, into which a resin is filled and is then hardened. In the sealing process, the resin is filled into certain gaps that are formed by the drawing process of the frame 105. Thus, it is possible to form isolation portions 142 integrally together with the other portions of the package 104 by the resin. In this state, the electrode surfaces 121 of the terminals 102 and the terminal supports 151 are exposed in the mounting surface of the semiconductor device. After being detached from the mold, the semiconductor device is subjected to the plating process, wherein the exposed surfaces 121 are plated. In the cutting process, the terminal supports 151a are cut out and removed by the half dicing that is effected in the mounting surface side. Then, the other terminal supports 151b, which are exposed to encompass the four side ends of the frame unit, are cut out by the full dicing, so that each unit can be individually isolated from the others. Incidentally, it is possible to cut out corners of the package 104 along 'slanted' cutting lines in chamfering as necessary. Thus, it is possible to completely produce the semiconductor device whose configuration is shown in FIG. 14.

Sixth Embodiment

Figure 16A:
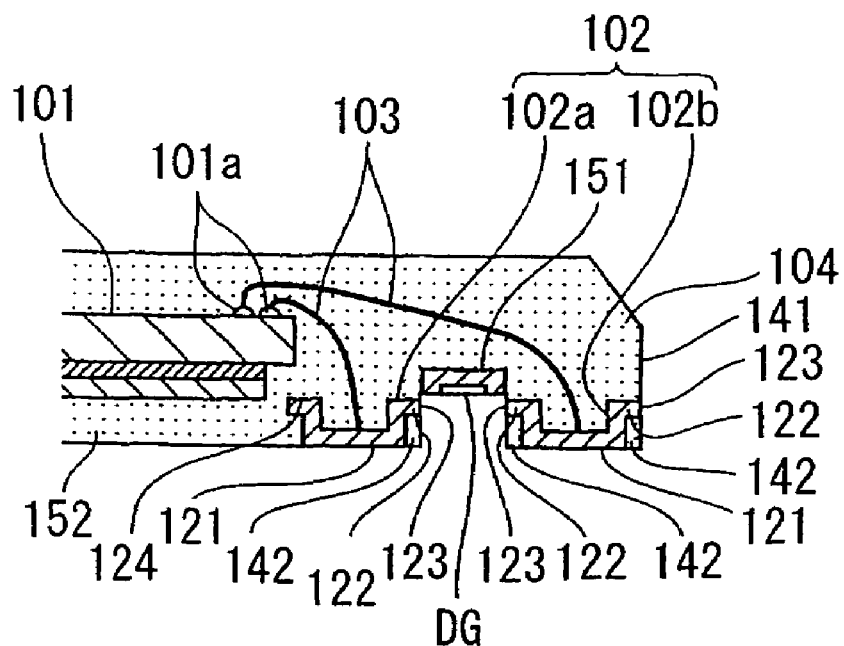
FIG. 16A is a sectional view showing selected parts of a semiconductor device that is produced in accordance with a sixth embodiment of the invention.

Next, a semiconductor device of a sixth embodiment of the invention will be described with reference to FIG. 16A. In the semiconductor device of the sixth embodiment, a semiconductor chip 101 has pads 101a that are electrically connected with inner terminals 102a and outer terminals 102b, are aligned in different lines respectively, via fine lines 103. Most of the parts of the semiconductor device such as the semiconductor chip 101 and terminals 102 are enclosed and sealed within a package 104 while electrode surfaces 121 of the terminals 102 are externally exposed. In the sixth embodiment, each of the electrode surfaces 121 has a square shape.

A dicing groove DG is formed in the prescribed area between the inner terminal 102a and outer terminal 102b, wherein it is made by cutting the prescribed area of the package 104 by the half dicing that is effected in the mounting surface side. A terminal support 151 is embedded within the package 104 and is extended along the dicing groove DG. In addition, a stage 152 for mounting the semiconductor chip 101 thereon and its stage supports 153 are embedded within the package 104 substantially at its center area.

Each of the terminals 102 provides an electrode surface 121 having substantially a square shape in plan view, an interconnecting portion 122, an exposed terminal surface 123, and a stopper 124. Herein, the interconnecting portion 122 is arranged at a deeper position drawn into the package 104 compared to the electrode surface 121 and is extended towards a cut surface 141 corresponding to the side wall of the dicing groove DG. The terminal surface of the interconnecting portion 122 is exposed on the cut surface as the exposed terminal surface 123. The stopper 124 is formed at a deeper position drawn into the package 104 compared to the electrode surface 121 and is extended in a direction opposite to the extending direction of the interconnecting portion 122. In addition, an isolation portion 142 is formed as an integral part of the package 104 made by the resin and is arranged in the prescribed area between the electrode surface 121 and exposed terminal surface 123 of the terminal 102.

Next, the manufacturing method of the semiconductor device of the sixth embodiment will be described below.

Figure 17:
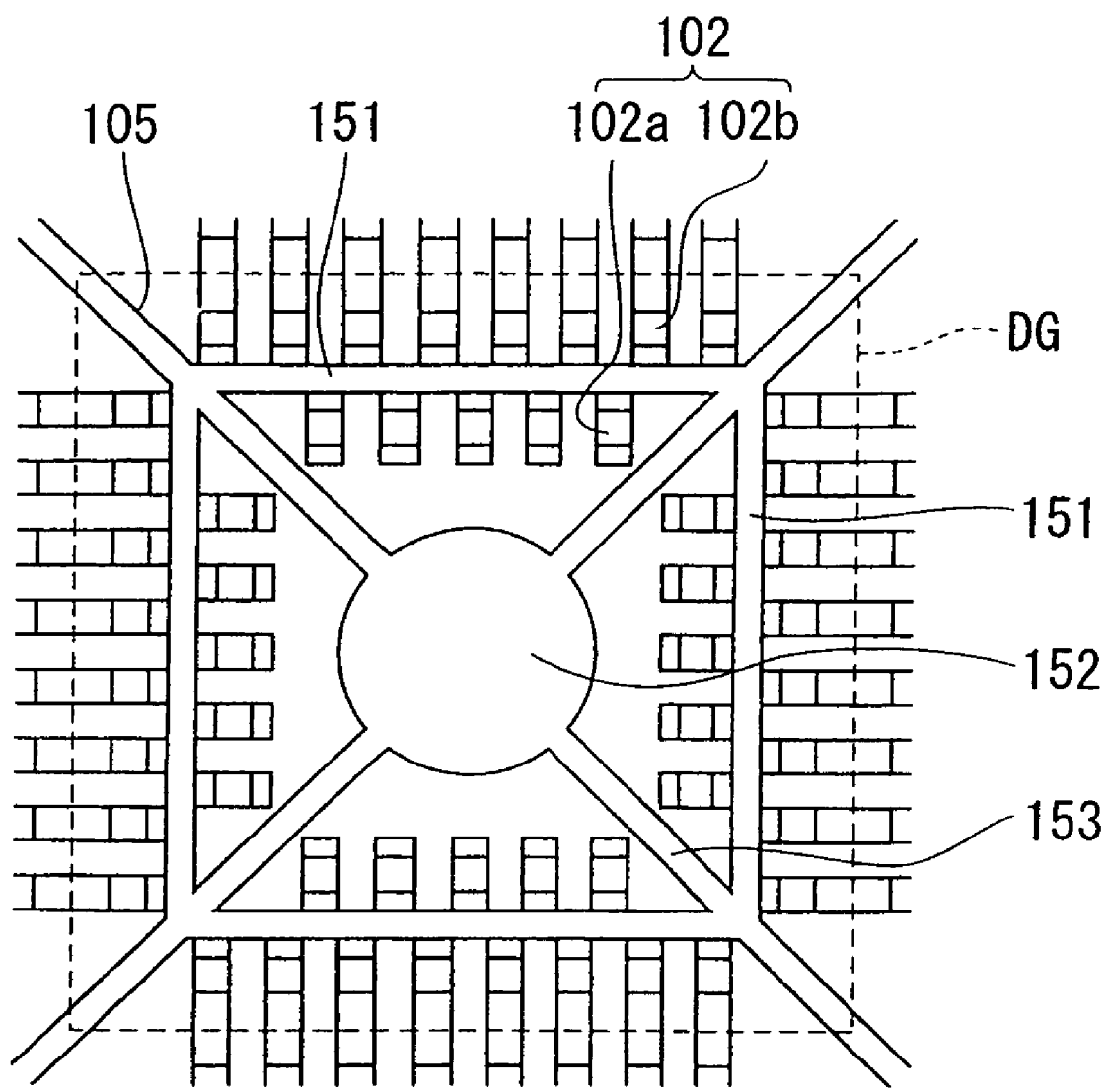
FIG. 17 is a plan view showing one unit of a lead frame that is viewed from the mounting surface and is used to produce the semiconductor device of the sixth embodiment.

FIG. 17 is a plan view of one unit of a lead frame 105 that is viewed from the mounting surface and is produced in the frame forming process. In the actual production, numerous units of frames are provided that are horizontally arranged and are interconnected together in a multiple interconnected frame assembly. The frame 105 is composed of a metal plate substantially having an externally square shape. A 'circular' stage 152 for mounting a semiconductor chip 101 thereon is formed substantially at the center of the 'square' frame 105. Four terminal supports 151, each of which interconnects together the prescribed number of terminals 102, are arranged in the peripheral area of the stage 152 and are combined together in a square form. Thus, the ends of the terminal supports 151 are coupled together at the four intersecting points therebetween. Four stage supports 153 are extended inwardly from the four intersecting points formed among the four terminal supports 151, so that they are provided to support the 'circular' stage 152 at its four positions. Each of the terminal supports 151 interconnects together the inner terminals 102a and outer terminals 102b. Specifically, the inner terminals are aligned along the inside of the terminal support 151, and the outer terminals are aligned along the outside of the terminal support 151. The outer terminals 102b are extended outwardly from the terminal support 151 and are interconnected with other outer terminals belonging to an adjacent frame unit (not shown).

In the frame forming process, the drawing process is performed on the frame 105.

Figure 18:
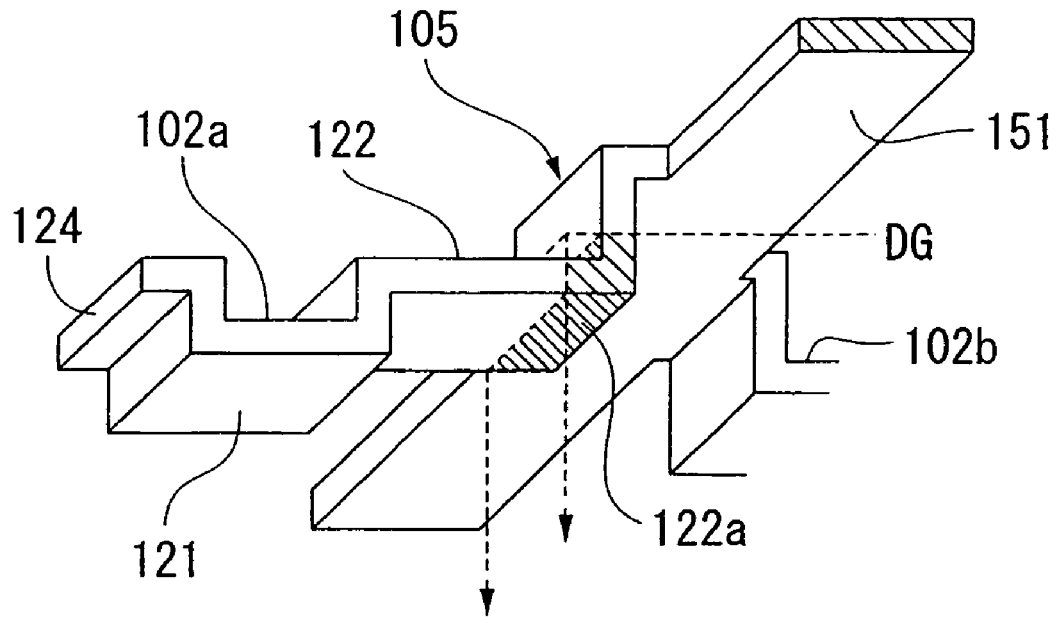
FIG. 18 is a perspective view showing a positional relationship among a terminal support, an inner electrode, and its peripheral elements in the frame shown in FIG. 17.

FIG. 18 is a perspective view showing the detailed structure of the terminal support 151 connected with the inner terminal 102a within the frame 105. The drawing process is performed in two stages with respect to the frame 105. That is, the interconnecting portion 122 and the stopper 124 are drawn by one stage into the package 104, so that they are embedded at a deep position within the package 104 compared to the electrode surface 121 that is exposed on the mounting surface. In addition, the terminal support 151 are further drawn by one stage into the package 104, so that it is embedded at a deeper position within the package 104. The aforementioned drawing process can be easily performed by press working. Incidentally, the stage 152 is adequately adjusted in position and depth in the package 104 by adjusting drawing levels applied to the stage supports 153, which are extended inwardly from the terminal supports 151, so that the semiconductor chip 101 is arranged substantially at the center of the package 104.

In the frame assembling process, the semiconductor chip 101 is mounted on the stage 152 in a face-up manner, so that the pads 101a thereof are connected with the backsides of the terminals 102 by fine lines 103 respectively. In this manner, it is possible to produce a frame assembly, which is installed in the prescribed mold and is subjected to the sealing process. In the sealing process, most of the elements of the frame assembly except the electrode surfaces 121 are sealed within the package 104 by the resin. In the cutting process, half dicing is performed from the mounting surface side in the length direction of the terminal support 151, which is originally embedded in the resin package 104, in such a way that the upper layer of the terminal support 151 is cut out by the prescribed width, which is broader than the width of the terminal support 151, and by the prescribed depth that does not reach the terminal support 151. Thus, the hatched portion 122a of the interconnecting portion 122 is cut out along with dotted lines (representing a dicing groove DG) in FIG. 18, so that the inner terminal 102a is completely isolated from the terminal support 151. As a result, the exposed terminal surface 123 of the interconnecting portion 122 is exposed on the cut surface or side wall of the dicing groove DG shown in FIG. 16. In addition, the isolation portion 142 is formed as an integral part of the package 104 made by the resin and is arranged in the prescribed area between the electrode surface 121 and exposed terminal surface 123 of the terminal 102a.

The above is the detailed description for the inner terminal 102a. Since plural frame units adjoin together, the outer terminal 102b is isolated from the others by performing full dicing on the outer periphery of the frame unit along dotted lines (representing dicing grooves DG) shown in FIG. 17. With respect to the outer terminal 102b, the exposed terminal surface 123 of the interconnecting portion 122 is exposed on the cut surface 141 that is formed by the full dicing performed on the outer periphery of the frame unit, wherein the isolation portion 142 is formed as an integral part of the package 104 made by the resin and is arranged in the prescribed area between the electrode surface 121 and exposed terminal surface 123.

The sixth embodiment does not cut out and remove the terminal supports 151 from the semiconductor device when performing dicing with respect to the terminal 102. Generally speaking, when cutting out and removing the whole length of the terminal support 151 made by the prescribed metal, the cutting machine bears a relatively large load in cutting, which easily may cause a destruction or blinding of a dicing blade. That is, the sixth embodiment does not completely cut out the terminal support 151, instead cutting out only a small area of the interconnecting portion 122 with respect to the terminal 102. Therefore, it is possible to remarkably reduce the load of the cutting machine. In addition, it is possible to save time and electricity, and it is also possible to save the cost that may be required for replacing blades.

In the sixth embodiment, both the interconnecting portion 122 and stopper 124 are fixed in the resin while the electrode 121 is exposed on the mounting surface of the package 104. Hence, the terminal 102 would not be peeled off from the package 102 even though the electrode surface 121 is pulled out.

Figure 16B:
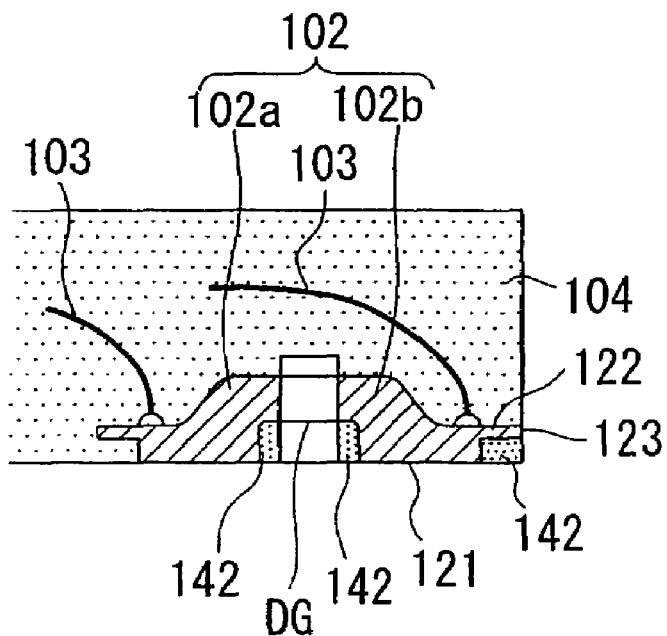
FIG. 16B is a sectional view showing a terminal and its peripheral elements that can be used in the semiconductor device of the sixth embodiment.

Moreover, it is possible to combine together half etching and press working in formation of the terminal 102, which is shown in FIG. 16B, for example. In this case, it is possible to make wire bonding areas planar, which yields good abilities for bonding and press working. In the sixth embodiment, as shown in FIG. 18, the interconnecting portion 122 is drawn into the package 104 by press working and is arranged at a deep position compared to the electrode surface 121, while the stopper 124 is drawn by one stage into the package 104 by half etching, wherein the stopper 124 has a relatively small thickness due to the half etching as compared to the thickness of the electrode surface 121.

Seventh Embodiment

Figure 19:
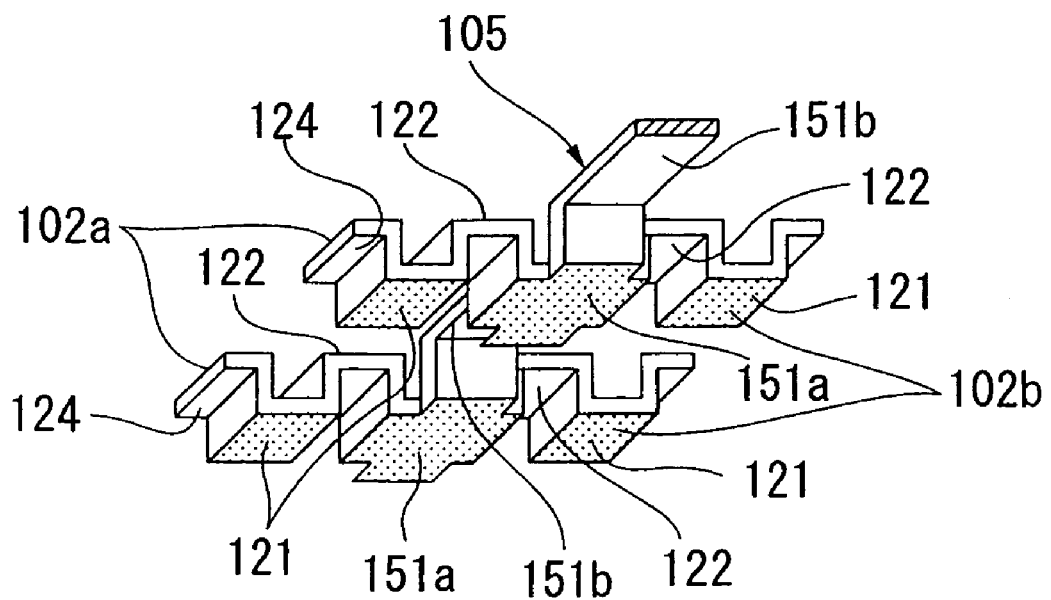
FIG. 19 is a perspective view showing a positional relationship among terminal supports, electrodes, and their peripheral elements in a lead frame that is used to produce a semiconductor device in accordance with a seventh embodiment of the invention.
Figure 20:
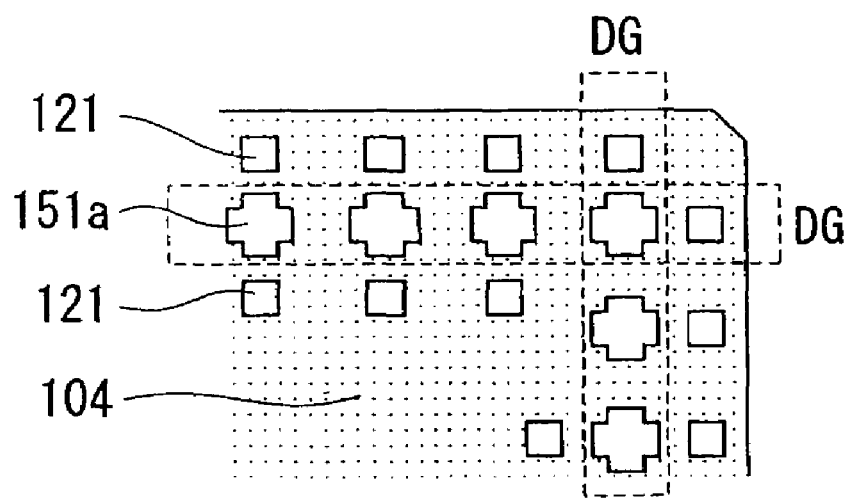
FIG. 20 is a plan view showing the mounting surface of a package of the semiconductor device of the seventh embodiment.

FIG. 19 is a perspective view showing terminal supports 151, inner terminals 102a, outer terminals 102b, and their peripheral elements in a frame 105, which is used to produce a semiconductor device in accordance with a seventh embodiment of the invention. This frame 105 is characterized by that both the inner terminal 102a and outer terminal 102b are arranged in a symmetrical manner at the same position of the terminal support 151, wherein the inner terminal 102a is extended inwardly from the terminal support 151 while the outer terminal 102b is extended outwardly from the terminal support 151. The frame 105 is subjected to the drawing process by one stage. With respect to each of the terminals 102, the interconnecting portion 122 and stopper 124 are drawn deep into the package 104 by one stage compared to the electrode surface 121 that is exposed on the mounting surface. As a result, the terminal support 151 is subjected to the drawing process at prescribed intervals along its lengthwise direction, so that it is transformed into a combination of different sections, namely, an exposed portion 151a that is exposed on the mounting surface and a drawn section 151b that is drawn in by one stage, which are alternately arranged. Both the tip ends of the interconnecting portions of the symmetrically arranged terminals 102 are bent and ascended up to the mounting surface relative to the exposed portion 151a of the terminal support 151 that is alternating in depth within the package 104. Specifically, the tip end of the inner terminal 102a is interconnected to the exposed portion 151a of the terminal support 151, and the tip end of the outer terminal 102b is interconnected to the exposed portion 151a of the terminal support 151. After completion of the sealing process for forming the package 104, the electrode surfaces 121 are respectively aligned on the mounting surface of the package 104, while the exposed portions 151a of the terminal supports 151 are also arranged at prescribed intervals therebetween along with the dicing grooves DG (see dotted lines in FIG. 20), along which the terminal supports 151 are respectively extended.

Figure 21:
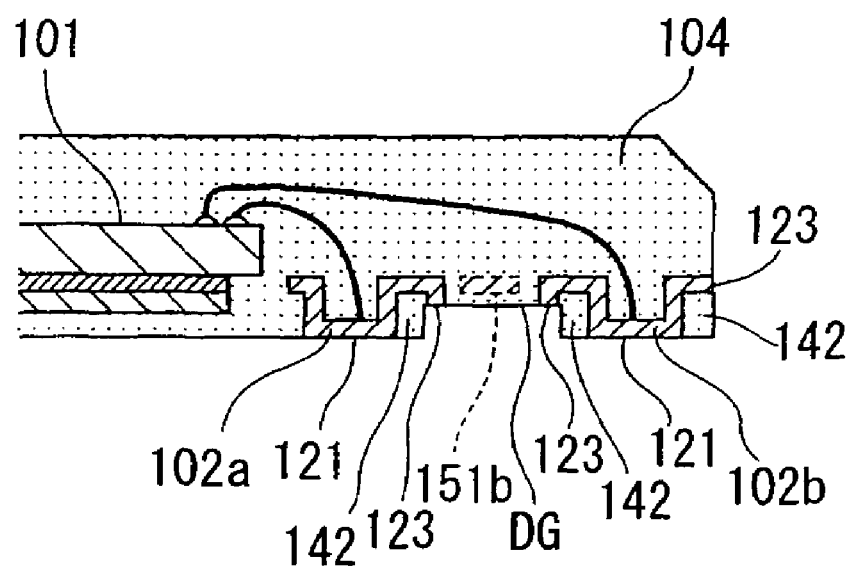
FIG. 21 is a sectional view showing selected parts of the semiconductor device of the seventh embodiment.

In the cutting process, half dicing is performed on the lines for aligning the exposed portions 151a of the terminal supports 151. Due to the half dicing, all the exposed portions 151a are completely cut out and removed from the package 104, so that the dicing grooves DG are formed by the prescribed width and the prescribed depth by which the drawn portions 151b of the terminal supports 151 are not cut out. In addition, full dicing is performed with respect to the outer periphery of a semiconductor device of one unit. Thus, it is possible to produce the semiconductor device whose configuration is shown in FIG. 21. Herein, the exposed terminal surface 123 of the terminal 102 is not exposed on the side wall of the dicing groove DG but is exposed on the bottom of the dicing groove DG. In addition, the drawn portions 151b of the terminal support 151 remain within the package 104 below the bottom of the dicing groove DG which is shown by dotted lines in FIG. 21. Like the foregoing embodiments, the seventh embodiment also provides the isolation portion 142 in the prescribed area between the electrode surface 121 and exposed terminal surface 123 with respect to each of the terminals 102.

The seventh embodiment is characterized in that the overall area of the terminal support 151 is not completely cut out in the cutting process. That is, the seventh embodiment cuts out only the exposed portions 151a of the terminal support 151. Therefore, it is possible to remarkably reduce the load of the cutting machine in the cutting process of the seventh embodiment compared to the foregoing cutting process in which the overall area of the terminal support 151 is completely cut out. In addition, it is possible to save time and electricity, and it is also possible to save the cost that may be required for replacing blades for use in the cutting machine. The aforementioned sixth embodiment provides a relatively large thickness for the frame structure because there are provided three elevations in the arrangement of the prescribed parts (e.g., electrode surface, interconnecting portion, and terminal support) of the terminal, which is shown in FIG. 18. In contrast to the sixth embodiment, the seventh embodiment can reduce the thickness of the frame structure because there are provided two elevations in the arrangement of the prescribed parts of the terminal, which is shown in FIG. 19.

In the seventh embodiment, both the interconnecting portions 122 and the stopper 124 are fixed in the resin while the electrode surface 121 is exposed on the mounting surface. Hence, the terminal 102 would not be easily peeled off from the package 104 even though the electrode surface 121 is pulled out.

Eighth Embodiment

Next, a description will be given with respect to a semiconductor device of an eighth embodiment of the invention, which is basically similar to the foregoing second embodiment except for the designated configuration for the mounting surface. Hence, the eighth embodiment will be described with respect to examples of the mounting surface of the package.

Figure 22:
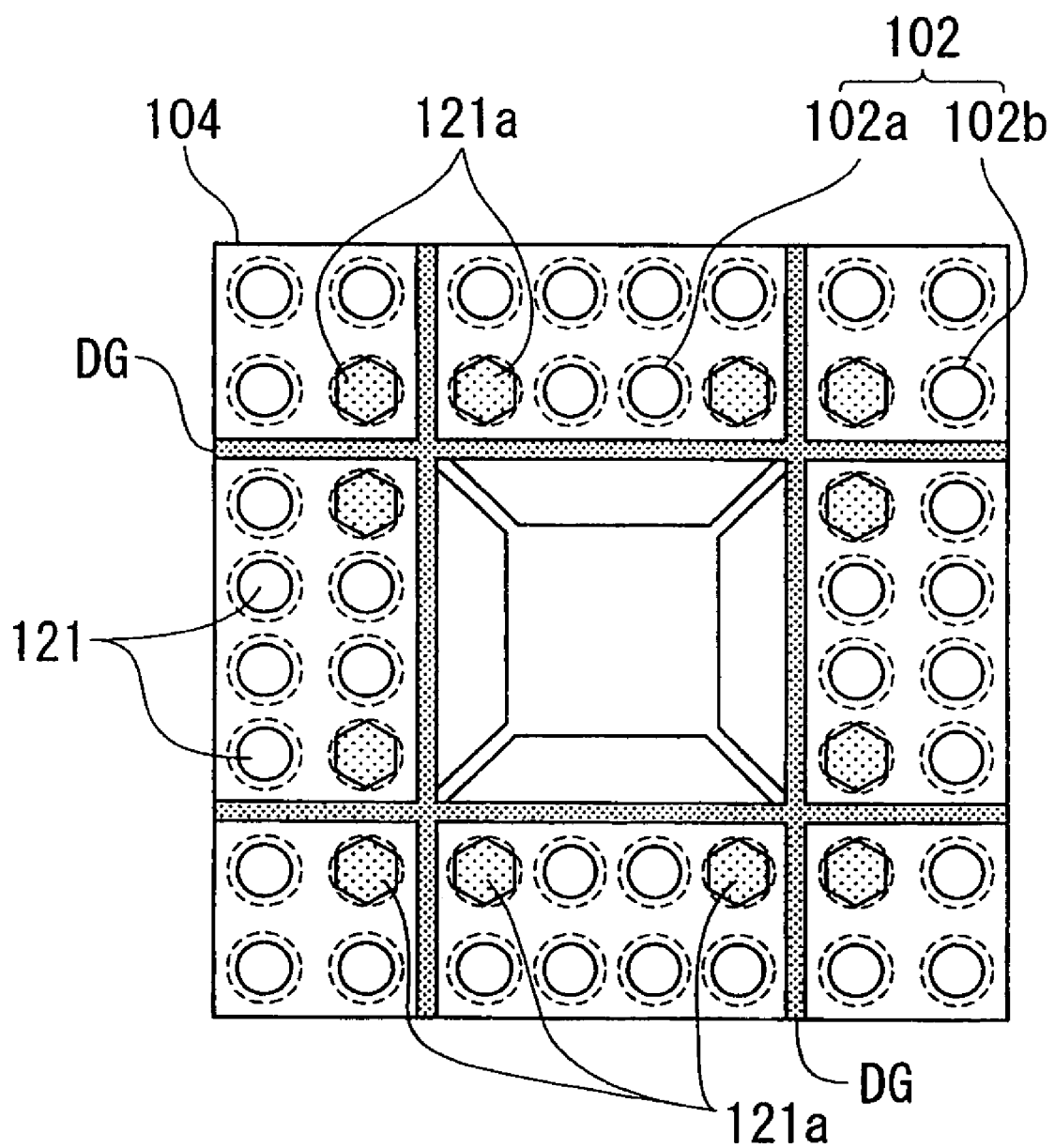
FIG. 22 is a plan view showing an example of the mounting surface of a package of a semiconductor device in accordance with an eighth embodiment of the invention.

FIG. 22 shows an example of the mounting surface of the package 104, wherein as compared to the foregoing mounting surface of the second embodiment shown in FIG. 5, there are provided 'deformed' electrode surfaces 121a that differ from the normal 'circular' electrode surfaces 121 and are arranged in proximity to the intersecting points between the dicing grooves DG. These deformed electrode surfaces 121a are arranged for the purpose of indicating directions or signs for realizing the accurate dicing alignment in the cutting process.

Figure 23:
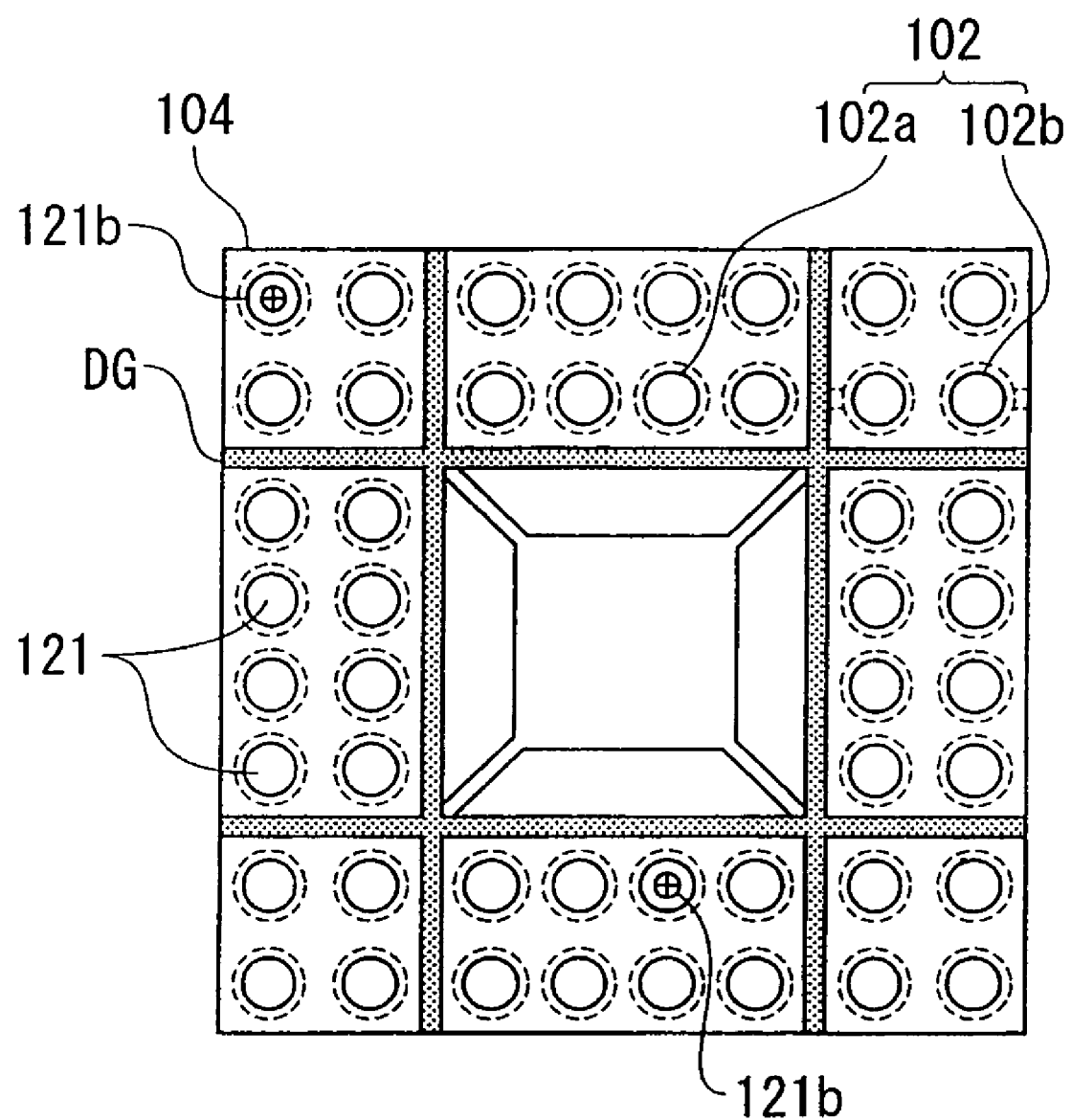
FIG. 23 is a plan view showing another example of the mounting surface of the package of the semiconductor device of the eighth embodiment.

FIG. 23 shows another example of the mounting surface of the package 104, wherein there are provided 'marked' electrode surfaces 121b that have prescribed marks and are arranged asymmetrically with each other. The semiconductor device of the foregoing second embodiment has an externally square shape, wherein the terminals are regularly arranged on the mounting surface. Therefore, the human operator may experience a difficulty in judging the accurate direction for connecting the semiconductor device with the external circuit. For this reason, a deformation or a mark is applied to at least one terminal, which is asymmetrically arranged compared to the other terminals as shown in FIG. 23, so that the human operator can visually recognize and identify it on the mounting surface. Therefore, the direction of the semiconductor device to be connected with the external circuit can be easily detected not only by the human eye but also by an optical reader. Thus, it is possible to avoid occurrence of errors in wiring.

Figure 24:
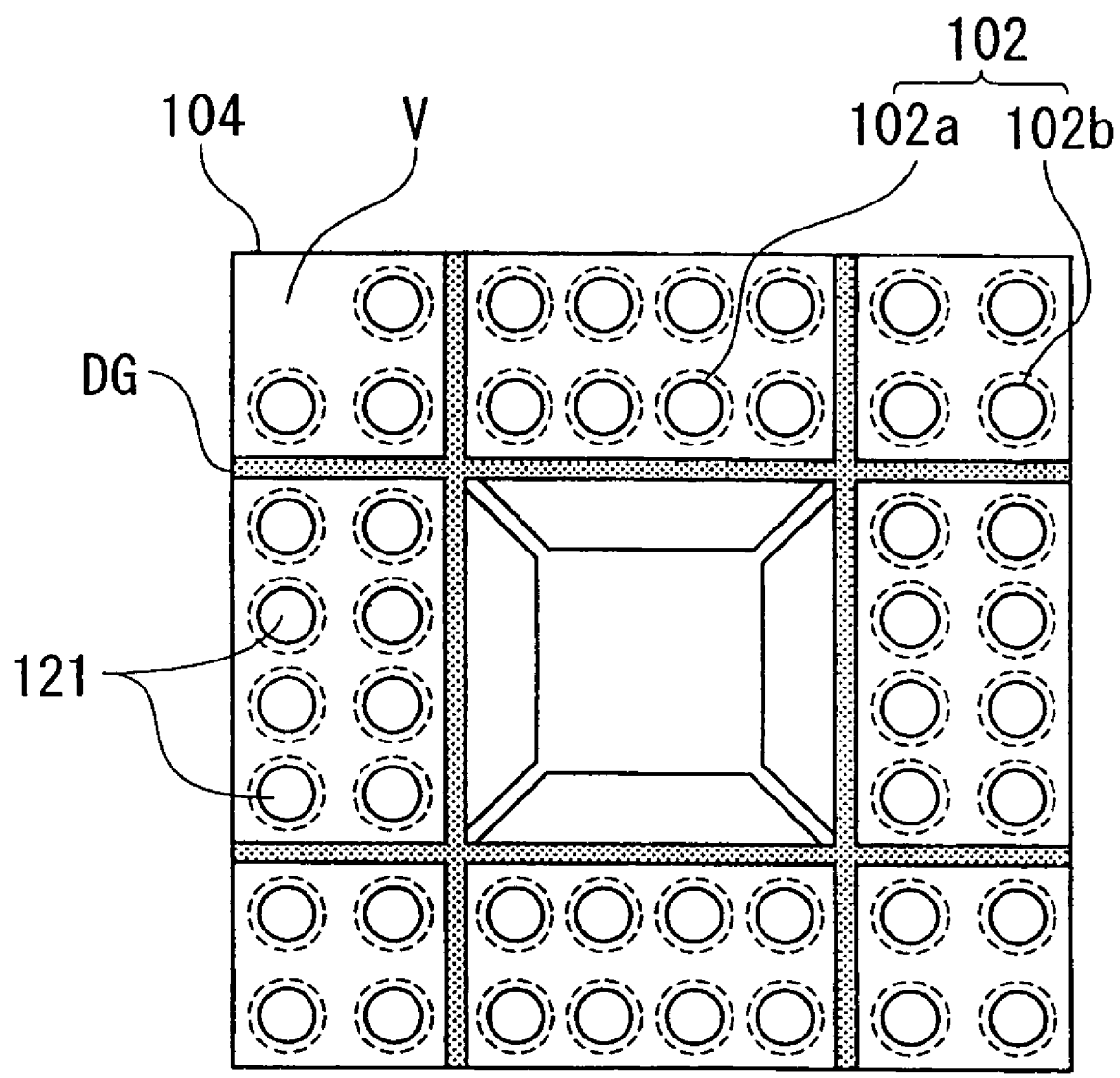
FIG. 24 is a plan view showing a further example of the mounting surface of the package of the semiconductor device of the eighth embodiment.
Figure 25:
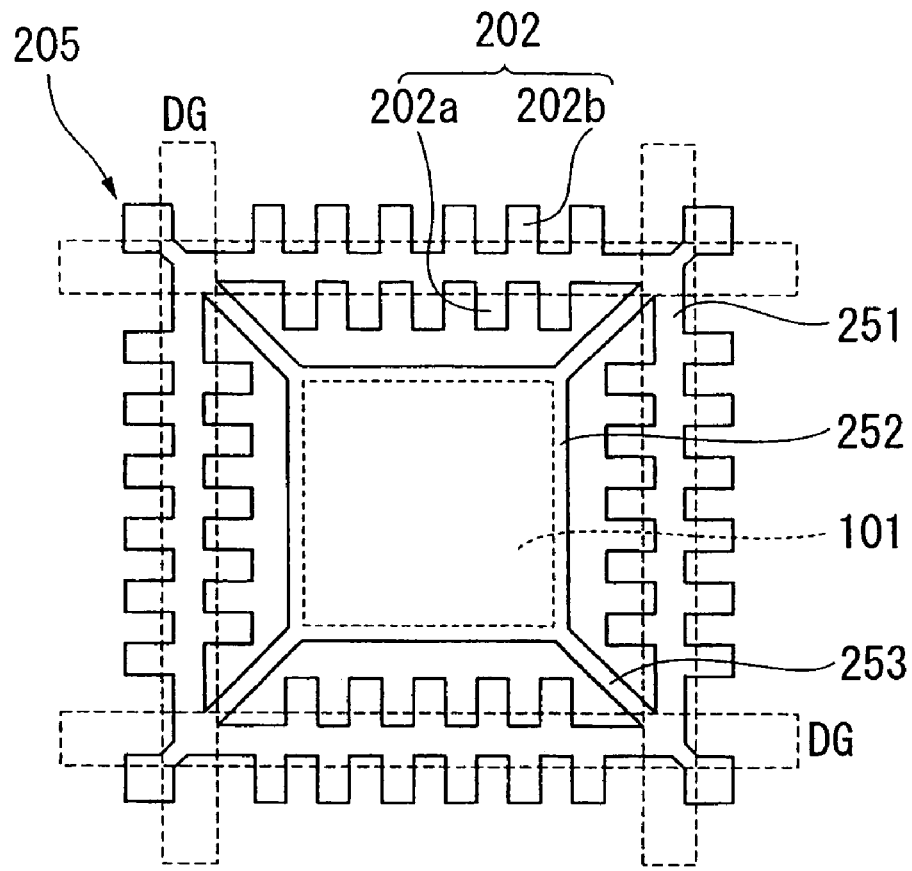
FIG. 25 is a plan view showing the structure of the conventional lead frame that is used to produce a semiconductor device.
Figure 26:
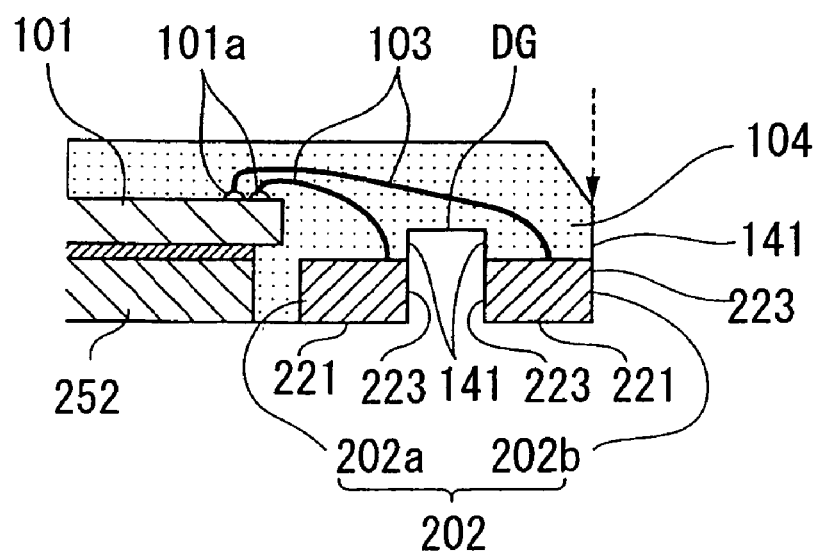
FIG. 26 is a sectional view showing selected parts of the cross section of the semiconductor device that is produced by the conventional lead frame shown in FIG. 25.
Figure 27A:
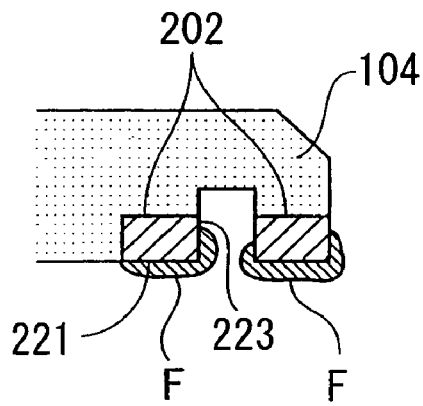
FIG. 27A is a sectional view diagrammatically showing selected parts of the semiconductor device in which a solder fillet is formed to provide an unwanted connection between the terminal surface and electrode surface of a terminal.
Figure 27B:
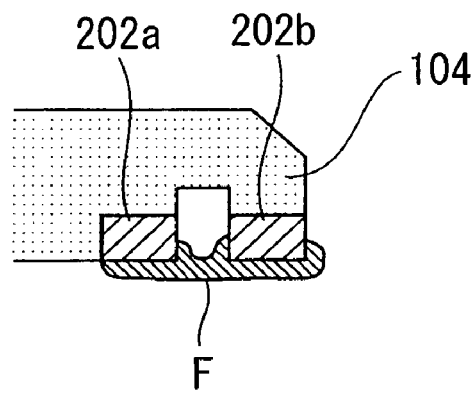
FIG. 27B is a sectional view diagrammatically showing selected parts of the semiconductor device in which a solder bridge is formed to connect together adjoining terminals.
Figure 27C:
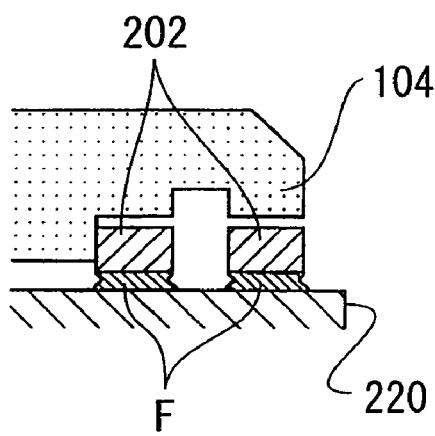
FIG. 27C is a sectional view diagrammatically showing an unwanted separation between terminals and a package that is pulled up.
Figure 27D:
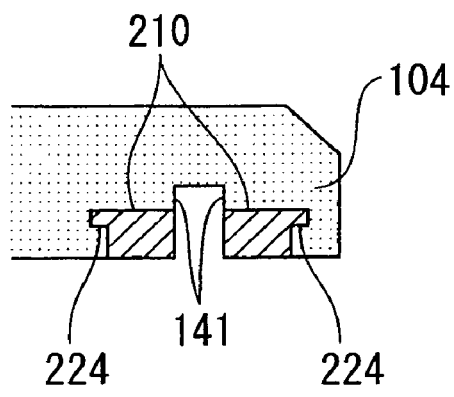
FIG. 27D is a sectional view diagrammatically showing a solution for avoiding the separation between terminals and a package.

FIG. 24 shows a further example of the mounting surface of the package 104, which does not apply marks to asymmetrically arranged terminals shown in FIG. 23. That is, this example of the mounting surface is characterized by the asymmetrical arrangement of the terminals on the mounting surface. Specifically, the position 'V' proximate to one corner of the square mounting surface is empty and a terminal is not arranged thereat. Due to the provision of such a vacancy in the arrangement of the terminals, the human operator can easily recognize the direction of the semiconductor device to be connected with the external circuit. Hence, it is possible to avoid the occurrence of errors in wring.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A semiconductor package comprising:
   a plurality of outer leads arranged in an outer periphery of a bottom of said package, said outer leads being exposed to an exterior of said package and adapted to provide electrical connections with a substrate; and
   a plurality of inner leads that extend from a periphery of a stage, and integrally formed with the stage, for supporting a semiconductor chip, a distal end of each inner lead being positioned lower than the stage, said distal ends of said inner leads being exposed to said exterior on said bottom of said package and arranged inwardly of said outer leads with respect to said periphery of said bottom of said package, said distal ends of said inner leads are adapted to provide electrical connections with the substrate.

2. A semiconductor package according to claim 1, wherein all of the inner leads are placed at a common potential.

3. A method of manufacturing a semiconductor package that provides a plurality of outer leads in an outer periphery of a bottom of the package and a plurality of inner leads that extend from a periphery of a stage, and integrally formed with the stage, for supporting a semiconductor chip, a tip end of each inner lead being positioned lower than the stage, and being exposed to a surface of the package, said method comprising the steps of:
   setting a lead frame in a metal mold;
   arranging the tip end of each inner lead being positioned lower than the stage in the metal mold;
   injecting a resin into the metal mold;
   clamping the metal mold in proximity to the outer leads; and
   sealing the semiconductor chip and the lead frame with the resin so as to expose the lower surfaces of the inner leads from the resin.

4. A semiconductor device comprising:
   a package made by a resin, said package having a mounting surface;
   a semiconductor chip that is encapsulated in the package;
   a plurality of terminals electrically connected with pads of the semiconductor device, wherein electrode surfaces of the terminals are exposed and arranged on said mounting surface, and wherein each of the terminals includes an interconnecting portion that is horizontally extended within the package to provide a terminal surface exposed on a cut surface, each of the electrode surfaces being arranged along an outer periphery of the package and exposed, each of the terminals having a portion extending inwardly in the package substantially perpendicularly to the electrode surface exposed on the mounting surface, a prescribed angle being formed between the portion extending inwardly and the interconnecting portion; and a plurality of isolation portions formed as integral parts of the package, each of which being arranged in a prescribed area between the electrode surface and the exposed terminal surface with respect to each of the terminals, the isolation portions being formed in a region between the portion extending inwardly and the interconnecting portion.

5. A semiconductor device according to claim 4, wherein the cut surface corresponds to one of: a side wall of the package, and a side wall of a dicing groove formed by dicing terminal supports in the package.

6. A semiconductor device according to claim 4, wherein the electrode surface has a circular shape or a square shape.

7. A semiconductor device according to claim 5, wherein the electrode surface has a circular shape or a square shape.

8. A semiconductor device according to claim 4, wherein the electrode surfaces of the terminals are subjected to asymmetric arrangement on the mounting surface.

9. A semiconductor device according to claim 4, wherein the cut surface and the mounting portion are substantially perpendicular to each other, and at least one of the isolation portions forms a part of the cut portion and a part of the mounting portion.

* * * * *